(12) United States Patent
Ishibe et al.

(10) Patent No.: US 11,075,345 B2
(45) Date of Patent: Jul. 27, 2021

(54) ORGANOMETALLIC COMPOUND AND ORGANIC LIGHT-EMITTING DEVICE INCLUDING THE SAME

(71) Applicants: SAMSUNG ELECTRONICS CO., LTD., Suwon-si (KR); Samsung SDI Co., Ltd., Yongin-si (KR)

(72) Inventors: Satoko Ishibe, Seongnam-si (KR); Hyejin Bae, Suwon-si (KR); Wook Kim, Suwon-si (KR); Changho Noh, Suwon-si (KR); Sangho Park, Anyang-si (KR); Virendra Kumar Rai, Hwaseong-si (KR); Miyoung Chae, Suwon-si (KR); Dmitry Kravchuk, Hwaseong-si (KR)

(73) Assignees: SAMSUNG ELECTRONICS CO., LTD., Gyeonggi-do (KR); SAMSUNG SDI CO., LTD., Gyeonggi-do (KR)

( * ) Notice: Subject to any disclaimer, the term of this patent is extended or adjusted under 35 U.S.C. 154(b) by 448 days.

(21) Appl. No.: 15/421,715

(22) Filed: Feb. 1, 2017

(65) Prior Publication Data
US 2017/0294596 A1 Oct. 12, 2017

(30) Foreign Application Priority Data
Apr. 8, 2016 (KR) .......................... 10-2016-0043634

(51) Int. Cl.
*H01L 51/50* (2006.01)
*H01L 51/54* (2006.01)
*H01L 51/00* (2006.01)
*C07F 15/00* (2006.01)
*C09K 11/06* (2006.01)

(52) U.S. Cl.
CPC ...... *H01L 51/0085* (2013.01); *C07F 15/0033* (2013.01); *C09K 11/06* (2013.01); *C09K 2211/1007* (2013.01); *C09K 2211/1044* (2013.01); *C09K 2211/185* (2013.01);
(Continued)

(58) Field of Classification Search
CPC ............ C07F 15/0033; H01L 51/0085; H01L 51/5012; H01L 51/5016; H01L 2251/552; C09K 11/06; C09K 2211/185; C09K 2211/1007; C09K 2211/1044
USPC ................... 428/690, 691, 917; 427/58, 66; 313/500–512; 257/40, 88–104, 257/E51.001–E51.052; 252/301.16–301.35
See application file for complete search history.

(56) References Cited

U.S. PATENT DOCUMENTS 7,553,560 B2 6/2009 Lamansky et al.
7,585,573 B2 9/2009 Lee et al.
(Continued)

FOREIGN PATENT DOCUMENTS

EP 2562229 A1 8/2012
JP 2006-008927 A 1/2006
(Continued)

OTHER PUBLICATIONS

Park et al., "The New Iridium Complexes Involving Pyridylpyridine Derivatives for the Saturated Blue Emission" Journal of Nanoscience and Nanotechnology (2012) vol. 12, pp. 668-673. (Year: 2012).*

(Continued)

*Primary Examiner* — Dylan C Kershner
(74) *Attorney, Agent, or Firm* — Cantor Colburn LLP

(57) ABSTRACT

An organometallic compound represented by one of Formulae 1A and 1B:

Formula 1A

Formula 1B (Continued)

wherein, in Formulae 1A and 1B, $A_{11}$, b20, $L_{11}$, M, m, n, and $R_{15}$ to $R_{20}$ are the same as described in the specification.

18 Claims, 1 Drawing Sheet

(52) U.S. Cl.
CPC ...... *H01L 51/5012* (2013.01); *H01L 51/5016* (2013.01); *H01L 2251/552* (2013.01)

(56) References Cited

U.S. PATENT DOCUMENTS

| | | | |
|---|---|---|---|
| 8,148,891 | B2 | 4/2012 | Tung et al. |
| 2005/0234240 | A1 | 10/2005 | Stossel et al. |
| 2010/0270916 | A1* | 10/2010 | Xia ........................ C09K 11/06 313/504 |
| 2016/0233443 | A1 | 8/2016 | Stoessel et al. |
| 2016/0336520 | A1* | 11/2016 | Boudreault ......... H01L 51/0085 |

FOREIGN PATENT DOCUMENTS

| | | |
|---|---|---|
| WO | 2002-015645 A1 | 2/2002 |
| WO | 2015-036074 A1 | 3/2015 |

OTHER PUBLICATIONS

Yonghao Zheng et al. "Thermally Induced Defluorination during a mer to fac Transformation of a Blue-Green Phosphorescent Cyclometalated Iridium(III) Complex", Inorg. Chem. 2012, 51, 290-297.

* cited by examiner

ORGANOMETALLIC COMPOUND AND ORGANIC LIGHT-EMITTING DEVICE INCLUDING THE SAME

CROSS-REFERENCE TO RELATED APPLICATION

This application claims priority to Korean Patent Application No. 10-2016-0043634, filed on Apr. 8, 2016, in the Korean Intellectual Property Office, and all the benefits accruing therefrom under 35 U.S.C. § 119, the content of which is incorporated herein in its entirety by reference.

BACKGROUND

1. Field

The present disclosure relates to an organometallic compound and an organic light-emitting device including the same.

2. Description of the Related Art

Organic light-emitting devices (OLEDs) are self-emission devices that have wide viewing angles, high contrast ratios, and short response times. In addition, OLEDs exhibit excellent luminance, driving voltage, and response speed characteristics, and produce full-color images.

In an example, an organic light-emitting device includes an anode, a cathode, and an organic layer disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. Carriers, such as holes and electrons, recombine in the emission layer to produce excitons. These excitons transit from an excited state to a ground state, thereby generating light.

Various types of organic light emitting devices are known. However, there still remains a need in OLEDs having low driving voltage, high efficiency, high brightness, and long lifespan.

SUMMARY

Provided are an organometallic compound and an organic light-emitting device including the same.

Additional aspects will be set forth in part in the description which follows and, in part, will be apparent from the description, or may be learned by practice of the presented embodiments.

According to an aspect of an embodiment, an organometallic compound is represented by one of Formulae 1A and 1B:

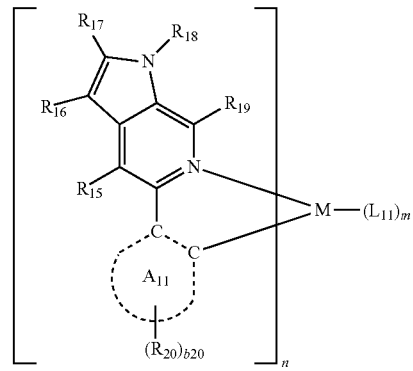

Formula 1A

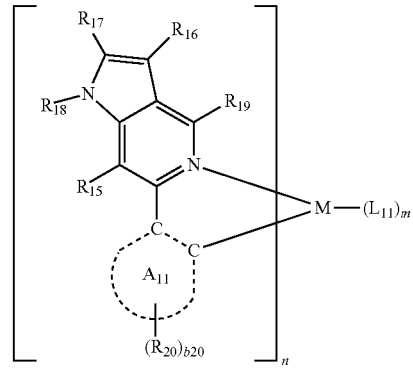

Formula 1B wherein in Formulae 1A and 1B,

M is selected from a Group 1 transition metal, a Group 2 transition metal, and a Group 3 transition metal, $A_{11}$ is selected from a $C_5$-$C_{20}$ carbocyclic group, $R_{15}$ to $R_{20}$ are each independently selected from hydrogen, deuterium, —F, —Cl, —Br, —I, a cyano group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —O($Q_1$), —S($Q_1$), and —Si($Q_1$)($Q_2$)($Q_3$), wherein $Q_1$ to $Q_3$ are each independently selected from a substituted or unsubstituted $C_1$-$C_{60}$ alkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, $R_{16}$ and $R_{17}$ are optionally bound via $Y_{11}$ to form a ring, $Y_{11}$ is a substituted or unsubstituted $C_1$-$C_5$ alkylene group, b20 is selected from 1, 2, 3, 4, 5, and 6, n is selected from 1, 2, and 3, $L_{11}$ is selected from a monodentate ligand and a bidentate ligand, and m is selected from 0, 1, 2, 3, and 4.

According to an aspect of another embodiment, an organic light-emitting device includes:
a first electrode;
a second electrode; and
an organic layer disposed between the first electrode and the second electrode,
wherein the organic layer includes an emission layer and at least one organometallic compound represented by one of Formulae 1A and 1B.

The organometallic compound may be included in the emission layer, the emission layer may further include a host, and the organometallic compound included in the emission layer may serve as a dopant.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
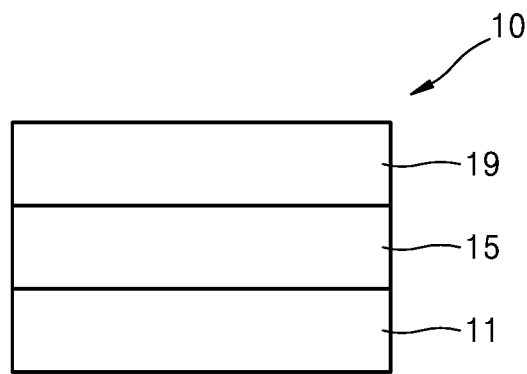
FIG. 1 is a schematic cross-sectional view illustrating an organic light-emitting device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present disclosure. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

An organometallic compound is represented by one of Formulae 1A and 1B:

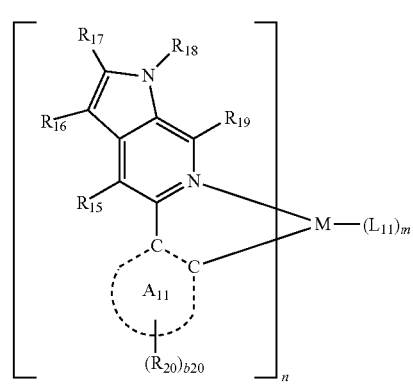

Formula 1A

-continued

Formula 1B

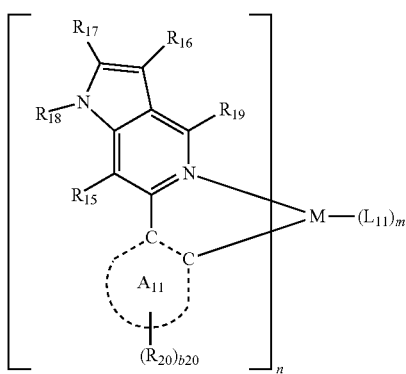

wherein, M in Formulae 1A and 1B may be selected from a Group 1 transition metal, a Group 2 transition metal, and a Group 3 transition metal.

In some embodiments, M in Formulae 1A and 1B may be selected from iridium (Ir), platinum (Pt), osmium (Os), ruthenium (Ru), rhodium (Rh), palladium (Pd), copper (Cu), silver (Ag), gold (Au), titanium (Ti), zirconium (Zr), hafnium (Hf), europium (Eu), terbium (Tb), and thulium (Tm), but embodiments are not limited thereto.

In some embodiments, M in Formulae 1A and 1B may be selected from Ir, Pt, Os, Ti, Zr, Hf, Eu, Tb, and Tm, but embodiments are not limited thereto.

In some embodiments, M in Formulae 1A and 1B may be selected from Ir, Pt and Os, but embodiments are not limited thereto.

In some embodiments, M in Formulae 1A and 1B may be Ir, but embodiments are not limited thereto.

$A_{11}$ in Formulae 1A and 1B may be selected from a $C_5$-$C_{20}$ carbocyclic group.

In some embodiments, $A_{11}$ in Formulae 1A and 1B may be selected from a benzene group, a naphthalene group, a phenanthrene group, an anthracene group, a triphenylene group, a pyrene group, and a chrysene group, but embodiments are not limited thereto.

In some embodiments, $A_{11}$ in Formulae 1A and 1B may be selected from a benzene group, a naphthalene group, a phenanthrene group, and an anthracene group, but embodiments are not limited thereto.

In some embodiments, $A_{11}$ in Formulae 1A and 1B may be selected from a benzene group and a naphthalene group, but embodiments are not limited thereto.

In some embodiments, $A_{11}$ in Formulae 1A and 1B may be a benzene group, but embodiments are not limited thereto.

$R_{15}$ to $R_{20}$ in Formulae 1A and 1B may be each independently selected from hydrogen, deuterium, —F, —Cl, —Br, —I, a cyano group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —O($Q_1$), —S($O_1$), and —Si($Q_1$)($Q_2$)($Q_3$), wherein $Q_1$ to $Q_3$ may be each independently selected from a substituted or unsubstituted $C_1$-$C_{60}$ alkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, $R_{16}$ and $R_{17}$ may optionally be bound via $Y_{11}$ to form a ring, and $Y_{11}$ may be a substituted or unsubstituted $C_1$-$C_5$ alkylene group.

In some embodiments, $R_{15}$ to $R_{20}$ in Formulae 1A and 1B may be each independently selected from hydrogen, deuterium, —F, —Cl, —Br, —I, a cyano group, a substituted or unsubstituted $C_1$-$C_{60}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —O($O_1$), —S($O_1$), and —Si($Q_1$)($Q_2$)($Q_3$), wherein $Q_1$ to $Q_3$ may be each independently selected from a substituted or unsubstituted $C_1$-$C_{60}$ alkyl group, a substituted or unsubstituted $C_6$-$C_{60}$ aryl group, and a substituted or unsubstituted $C_1$-$C_{60}$ heteroaryl group, and $R_{16}$ and $R_{17}$ may optionally be bound via $Y_{11}$ to form a ring, but embodiments are not limited thereto.

In some embodiments, $R_{15}$ to $R_{20}$ in Formulae 1A and 1B may be each independently selected from hydrogen, deuterium, —F, —Cl, —Br, —I, a cyano group, a $C_1$-$C_{20}$ alkyl group, a $C_3$-$C_{10}$ cycloalkyl group, and a $C_1$-$C_{10}$ heterocycloalkyl group;

a $C_1$-$C_{20}$ alkyl group, a $C_3$-$C_{10}$ cycloalkyl group, and a $C_1$-$C_{10}$ heterocycloalkyl group, each substituted with at least one selected from deuterium, —F, —Cl, —Br, and —I;

a phenyl group, a naphthyl group, a phenanthrenyl group, an anthracenyl group, a triphenylenyl group, a pyrenyl group, a chrysenyl group, a pyridinyl group, a pyrazinyl group, a pyrimidinyl group, a triazinyl group, a quinolinyl group, and an isoquinolinyl group;

a phenyl group, a naphthyl group, a phenanthrenyl group, an anthracenyl group, a triphenylenyl group, a pyrenyl group, a chrysenyl group, a pyridinyl group, a pyrazinyl group, a pyrimidinyl group, a triazinyl group, a quinolinyl group, and an isoquinolinyl group, each substituted with at least one selected from deuterium, —F, —Cl, —Br, —I, a $C_1$-$C_{20}$ alkyl group, a $C_1$-$C_{20}$ alkoxy group, a phenyl group, a naphthyl group, and —Si($Q_1$)($Q_{12}$)($Q_{13}$);

a phenyl group, a naphthyl group, a phenanthrenyl group, an anthracenyl group, a triphenylenyl group, a pyrenyl group, a chrysenyl group, a pyridinyl group, a pyrazinyl group, a pyrimidinyl group, a triazinyl group, a quinolinyl group, and an isoquinolinyl group, each substituted with at least one selected from a $C_1$-$C_{20}$ alkyl group, a phenyl group, and a naphthyl group that are each substituted with at least one selected from deuterium, —F, —Cl, —Br, and —I; and —O($Q_1$), —S($O_1$) and —Si($Q_1$)($Q_2$)($Q_3$), wherein $Q_1$ to $Q_3$ and $Q_{11}$ to $Q_{13}$ may be each independently selected from a $C_1$-$C_{20}$ alkyl group, a phenyl group, and a naphthyl group; and a $C_1$-$C_{20}$ alkyl group, a phenyl group, and a naphthyl group, each substituted with at least one selected from deuterium, —F, —Cl, —Br, and —I, and $R_{16}$ and $R_{17}$ may optionally be bound via $Y_{11}$ to form a ring, but embodiments are not limited thereto.

In some embodiments, $R_{15}$ to $R_{20}$ in Formulae 1A and 1B may be each independently selected from hydrogen, deuterium, —F, a methyl group, an ethyl group, an n-propyl group, an iso-propyl group, an n-butyl group, a sec-butyl group, an iso-butyl group, a tert-butyl group, an n-pentyl group, a methoxy group, an ethoxy group, a cyclopentyl group, a cyclohexyl group, and a cycloheptyl group;

a methyl group, an ethyl group, an n-propyl group, an iso-propyl group, an n-butyl group, a sec-butyl group, an iso-butyl group, a tert-butyl group, an n-pentyl group, a methoxy group, an ethoxy group, a cyclopentyl group, a cyclohexyl group, and a cycloheptyl group, each substituted with at least one selected from deuterium, —F, —Cl, —Br, and —I;

a phenyl group and a naphthyl group;

a phenyl group and a naphthyl group, each substituted with at least one selected from deuterium, —F, a methyl group, an ethyl group, an n-propyl group, an iso-propyl group, an n-butyl group, a sec-butyl group, an iso-butyl group, a tert-butyl group, an n-pentyl group, a phenyl group, a naphthyl group, and —Si(CH$_3$)$_3$;

a phenyl group and a naphthyl group, each substituted with at least one selected from a methyl group, an ethyl group, an n-propyl group, an iso-propyl group, an n-butyl group, a sec-butyl group, an iso-butyl group, a tert-butyl group, an n-pentyl group, a phenyl group, and a naphthyl group that are each substituted with at least one selected from deuterium and —F; and —O(Q$_1$), —S(Q$_1$) and —Si(Q$_1$)(Q$_2$)(Q$_3$), wherein $Q_1$ to $Q_3$ may be each independently selected from a methyl group, an ethyl group, an n-propyl group, an iso-propyl group, an n-butyl group, a sec-butyl group, an iso-butyl group, a tert-butyl group, an n-pentyl group, a phenyl group, and a naphthyl group; and a methyl group, an ethyl group, an n-propyl group, an iso-propyl group, an n-butyl group, a sec-butyl group, an iso-butyl group, a tert-butyl group, an n-pentyl group, a phenyl group, and a naphthyl group, each substituted with at least one selected from deuterium and —F, and $R_{16}$ and $R_{17}$ may optionally be bound via $Y_{11}$ to form a ring, but embodiments are not limited thereto.

In some embodiments, $R_{15}$ to $R_{20}$ in Formulae 1A and 1B may be each independently selected from hydrogen, deuterium, —F, a methyl group, an ethyl group, an n-propyl group, an iso-propyl group, an iso-butyl group, a tert-butyl group, a cyclopentyl group, a cyclohexyl group, —CD$_3$, —CD$_2$H, —CDH$_2$, —CF$_3$, —CF$_2$H, —CFH$_2$, —OCF$_3$, —Si(CH$_3$)$_3$, and a group represented by one of Formulae 5-1 to 5-15, $R_{16}$ and $R_{17}$ may optionally be bound via $Y_{11}$ to form a ring, but embodiments are not limited thereto.

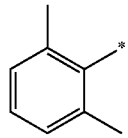

5-1

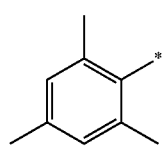

5-2

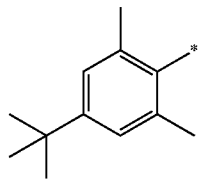

5-3

5-4

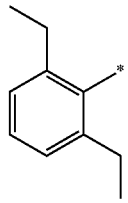

5-5

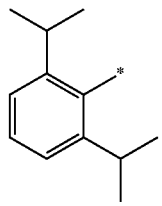

5-6

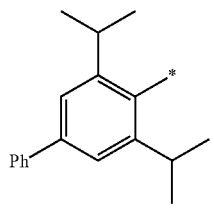

5-7

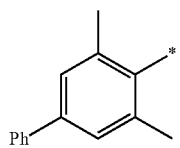

5-8

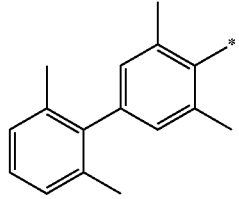

5-9

-continued 5-10
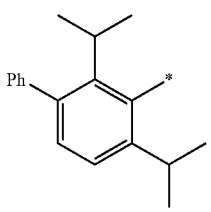

5-11
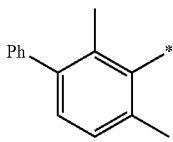

5-12
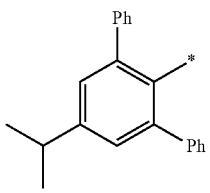

5-13
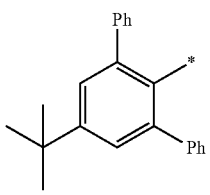

5-14
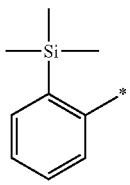

5-15
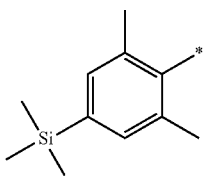

wherein, in Formulae 5-1 to 5-15,

* indicates a binding site to an adjacent atom, and "Ph" represents a phenyl group.

In some embodiments, $Y_{11}$ in Formulae 1A and 1B may be selected from a substituted or unsubstituted methylene group, a substituted or unsubstituted ethylene group, and a substituted or unsubstituted propylene group, but embodiments are not limited thereto.

In some embodiments, $Y_{11}$ in Formulae 1A and 1B may be a group represented by Formula 8-1, but embodiments are not limited thereto:

Formula 8-1
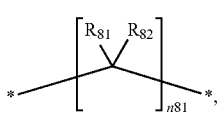

wherein, in Formula 8-1, $R_{81}$ and $R_{82}$ may be each independently selected from hydrogen, deuterium, —F, —Cl, —Br, —I, a cyano group, a $C_1$-$C_{20}$ alkyl group, a $C_3$-$C_{10}$ cycloalkyl group, and a $C_1$-$C_{10}$ heterocycloalkyl group;

a $C_1$-$C_{20}$ alkyl group, a $C_3$-$C_{10}$ cycloalkyl group, and a $C_1$-$C_{10}$ heterocycloalkyl group, each substituted with at least one selected from deuterium, —F, —Cl, —Br, and —I;

a phenyl group, a naphthyl group, a phenanthrenyl group, an anthracenyl group, a triphenylenyl group, a pyrenyl group, a chrysenyl group, a pyridinyl group, a pyrazinyl group, a pyrimidinyl group, a triazinyl group, a quinolinyl group, and an isoquinolinyl group;

a phenyl group, a naphthyl group, a phenanthrenyl group, an anthracenyl group, a triphenylenyl group, a pyrenyl group, a chrysenyl group, a pyridinyl group, a pyrazinyl group, a pyrimidinyl group, a triazinyl group, a quinolinyl group and an isoquinolinyl group, each substituted with at least one selected from deuterium, —F, —Cl, —Br, —I, a $C_1$-$C_{20}$ alkyl group, a $C_1$-$C_{20}$ alkoxy group, a phenyl group, a naphthyl group, and —Si($Q_{11}$)($Q_{12}$)($Q_{13}$);

a phenyl group, a naphthyl group, a phenanthrenyl group, an anthracenyl group, a triphenylenyl group, a pyrenyl group, a chrysenyl group, a pyridinyl group, a pyrazinyl group, a pyrimidinyl group, a triazinyl group, a quinolinyl group, and an isoquinolinyl group, each substituted with at least one selected from a $C_1$-$C_{20}$ alkyl group, a phenyl group, and a naphthyl group that are each substituted with at least one selected from deuterium, —F, —Cl, —Br, and —I; and —O($O_1$), —S($O_1$) and —Si($Q_1$)($Q_2$)($Q_3$), wherein $Q_1$ to $Q_3$ and $Q_{11}$ to $Q_{13}$ may be each independently selected from a $C_1$-$C_{20}$ alkyl group, a phenyl group, and a naphthyl group; and a $C_1$-$C_{20}$ alkyl group, a phenyl group, and a naphthyl group, each substituted with at least one selected from deuterium, —F, —Cl, —Br, and —I, n81 may be selected from 1, 2, and 3, and

* and *' each independently indicate a binding site to an adjacent atom.

In some embodiments, $Y_{11}$ in Formulae 1A and 1B may be represented by one of Formulae 9-1 and 9-10, but embodiments are not limited thereto:

9-1

9-2

9-3
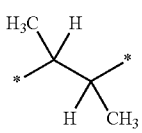

9-4
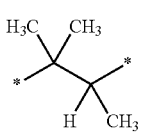

9-5
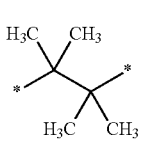

-continued

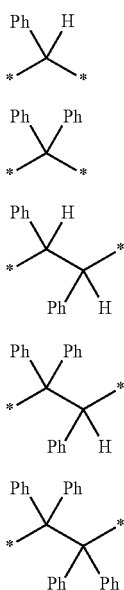

9-6

9-7

9-8

9-9

9-10 wherein, in Formulae 9-1 and 9-10,
"Ph" represents a phenyl group, and
* and *' each independently indicate a binding site to an adjacent atom.

b20 in Formulae 1A and 1B indicates the number of groups $R_{20}$, wherein b20 may be selected from 1, 2, 3, 4, 5, and 6. When b20 is 2 or greater, a plurality of groups $R_{20}$ may be identical to or different from each other.

In Formulae 1A and 1B, n indicates the number of ligands, each represented by

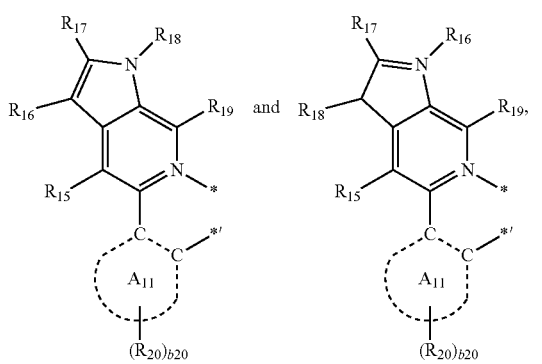

and * and *' herein each indicate a binding site to M in Formulae 1A and 1B. n in Formulae 1A and 1B may be selected from 1, 2, and 3. When n in Formulae 1A and 1B is 2 or greater, a plurality of ligand(s) may be identical to or different from each other.

In some embodiments, n in Formulae 1A and 1B may be selected from 2 and 3, but embodiments are not limited thereto.

In some embodiments, in Formulae 1A and 1B, M may be Ir and n may be 3, but embodiments are not limited thereto.

In some embodiments, in Formulae 1A and 1B, M may be Ir and n may be 2, but embodiments are not limited thereto.

In some embodiments, in Formulae 1A and 1B, M may be Ir and n may be 1, but embodiments are not limited thereto.

$L_{11}$ in Formulae 1A and 1B may be selected from a monodentate ligand and a bidentate ligand.

In some embodiments, in Formulae 1A and 1B, $L_{11}$ may be selected from a monodentate ligand, and $L_{11}$ may be selected from I$^-$, Br$^-$, Cl$^-$, a sulfide, a nitrate, an azide, a hydroxide, a cyanate, an isocyanate, a thiocyanate, water, acetonitrile, a pyridine, ammonia, carbon monoxide, P(Ph)$_3$, P(Ph)$_2$CH$_3$, PPh(CH$_3$)$_2$, and P(CH$_3$)$_3$, but embodiments are not limited thereto.

In some embodiments, in Formulae 1A and 1B, $L_{11}$ may be selected from a bidentate ligand, and $L_{11}$ may be selected from an oxalate, an acetylacetonate, a picolinic acid, 2-(2-hydroxyphenyl)-pyridine, 2-phenylpyridine, 1,2-bis(diphenylphosphino)ethane, 1,1-bis(diphenylphosphino)methane, a glycinate, an ethylenediamine, and 1,10-phenanthroline, but embodiments are not limited thereto.

In some embodiments, $L_{11}$ in Formulae 1A and 1B may be a ligand represented by one of Formulae 3-1 to 3-9, but embodiments are not limited thereto:

3-1

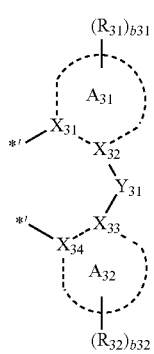

3-2

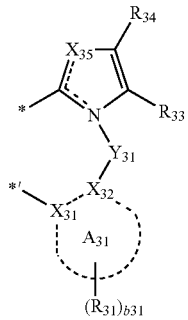

3-3

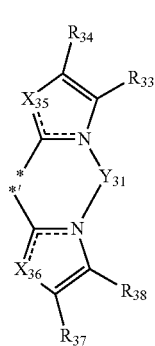

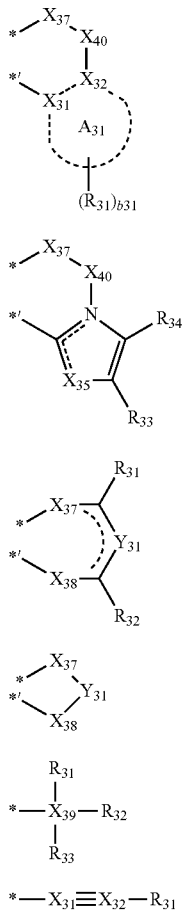

wherein, in Formulae 3-1 and 3-9, $A_{31}$ and $A_{32}$ may be each independently selected from a $C_5$-$C_{20}$ carbocyclic group and a $C_1$-$C_{20}$ heterocyclic group, $X_{31}$ to $X_{34}$ may be each independently selected from C and N, $X_{35}$ may be selected from O, S, and $N(R_{35})$, $X_{36}$ may be selected from O, S, and $N(R_{36})$, $X_{37}$ and $X_{38}$ may be each independently selected from N, O, $N(R_{33})$, $P(R_{33})(R_{34})$, and $As(R_{33})(R_{34})$, $X_{39}$ may be selected from P and As, $X_{40}$ may be selected from $C(=O)$ and $C(R_{35})(R_{36})$, $Y_{31}$ may be selected from a single bond, a double bond, a substituted or unsubstituted $C_1$-$C_5$ alkylene group, a substituted or unsubstituted $C_2$-$C_5$ alkenylene group, and a substituted or unsubstituted $C_6$-$C_{10}$ arylene group, $R_{31}$ to $R_{40}$ may be each independently selected from hydrogen, deuterium, —F, —Cl, —Br, —I, a cyano group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, $R_{31}$ and $R_{32}$ may optionally be bound to form a ring, $R_{33}$ and $R_{34}$ may optionally be bound to form a ring, $R_{37}$ and $R_{38}$ may optionally be bound to form a ring, b31 and b32 may be each independently selected from 1, 2, 3, and 4, and

* and *' each independently indicate a binding site to an adjacent atom.

In some embodiments, $A_{31}$ and $A_{32}$ in Formulae 3-1, 3-2, and 3-4 may be each independently selected from a benzene group, a naphthalene group, a fluorene group, a spiro-fluorene group, an indene group, a furan group, a thiophene group, a carbazole group, a benzofuran group, a benzothiophene group, a dibenzofuran group, a dibenzothiophene group, a pyrrole group, an imidazole group, a pyrazole group, a thiazole group, an isothiazole group, an oxazole group, an isoxazole group, a triazole group, a tetrazole group, a pyridine group, a pyrazine group, a pyrimidine group, a quinoline group, an isoquinoline group, a benzoquinoline group, a quinoxaline group, a quinazoline group, a naphthyridine group, a benzimidazole group, a benzoxazole group, an isobenzoxazole group, an oxadiazole group, and a triazine group, but embodiments are not limited thereto.

In some embodiments, $A_{31}$ and $A_{32}$ in Formulae 3-1, 3-2, and 3-4 may be each independently selected from a benzene group, a naphthalene group, a pyrrole group, a pyrazole group, a triazole group, a tetrazole group, a pyridine group, a pyrimidine group, a quinoline group, an isoquinoline group, and a triazine group, but embodiments are not limited thereto.

In some embodiments, in Formulae 3-2, 3-3, and 3-5, $X_{35}$ may be $N(R_{35})$ and $X_{36}$ may be $N(R_{36})$, but embodiments are not limited thereto.

In some embodiments, $X_{37}$ and $X_{38}$ in Formulae 3-4 to 3-7 may be each independently selected from O and $P(R_{33})(R_{34})$, but embodiments are not limited thereto.

In some embodiments, $X_{39}$ in Formula 3-8 may be P, but embodiments are not limited thereto.

In some embodiments, $Y_{31}$ in Formulae 3-1 to 3-3, 3-6, and 3-7 may be selected from a single bond, a substituted or unsubstituted methylene group, a substituted or unsubstituted ethylene group, a substituted or unsubstituted propylene group, and a substituted or unsubstituted phenylene group, but embodiments are not limited thereto.

In some embodiments, $R_{31}$ to $R_{40}$ in Formulae 3-1 to 3-9 may be each independently selected from hydrogen, deuterium, —F, —Cl, —Br, —I, a cyano group, a $C_1$-$C_{20}$ alkyl group, a $C_1$-$C_{20}$ alkoxy group, a $C_3$-$C_{10}$ cycloalkyl group, and a $C_1$-$C_{10}$ heterocycloalkyl group;

a $C_1$-$C_{20}$ alkyl group, a $C_1$-$C_{20}$ alkoxy group, a $C_3$-$C_{10}$ cycloalkyl group, and a $C_1$-$C_{10}$ heterocycloalkyl group, each substituted with at least one selected from deuterium, —F, —Cl, —Br, and —I;

a phenyl group, a naphthyl group, a phenanthrenyl group, an anthracenyl group, a triphenylenyl group, a pyrenyl group, a chrysenyl group, a pyridinyl group, a pyrazinyl group, a pyrimidinyl group, a triazinyl group, a quinolinyl group, and an isoquinolinyl group;

a phenyl group, a naphthyl group, a phenanthrenyl group, an anthracenyl group, a triphenylenyl group, a pyrenyl group, a chrysenyl group, a pyridinyl group, a pyrazinyl group, a pyrimidinyl group, a triazinyl group, a quinolinyl group, and an isoquinolinyl group, each substituted with at least one selected from deuterium, —F, —Cl, —Br, —I, a $C_1$-$C_{20}$ alkyl group, a $C_1$-$C_{20}$ alkoxy group, a phenyl group, a naphthyl group, and —Si($Q_{11}$)($Q_{12}$)($Q_{13}$);

a phenyl group, a naphthyl group, a phenanthrenyl group, an anthracenyl group, a triphenylenyl group, a pyrenyl group, a chrysenyl group, a pyridinyl group, a pyrazinyl group, a pyrimidinyl group, a triazinyl group, a quinolinyl group, and an isoquinolinyl group, each substituted with at least one selected from a $C_1$-$C_{20}$ alkyl group, a phenyl group, and a naphthyl group that are each substituted with at least one selected from deuterium, —F, —Cl, —Br, and —I, but embodiments are not limited thereto.

In some embodiments, $R_{31}$ to $R_{40}$ in Formulae 3-1 to 3-9 may be each independently selected from hydrogen, deuterium, —F, —Cl, —Br, —I, a cyano group, a methyl group, an ethyl group, a phenyl group, and a naphthyl group, but embodiments are not limited thereto.

m in Formulae 1A and 1B indicates the number of groups $L_{11}$, and m may be selected from 0, 1, 2, 3, and 4. When m is 2 or greater, a plurality of groups $L_{11}$ may be identical to or different from each other.

In some embodiments, m in Formulae 1A and 1B may be selected from 0, 1, and 2, but embodiments are not limited thereto.

In some embodiments, m in Formulae 1A and 1B may be selected from 0 and 1, but embodiments are not limited thereto.

In some embodiments, m in Formulae 1A and 1B may be 0, but embodiments are not limited thereto.

In some embodiments, the organometallic compound represented by one of Formulae 1A and 1B may be represented by one of Formulae 1-1 and 1-2:

wherein, in Formulae 1-1 and 1-2,

M, n, $L_{11}$, and m may be the same as those described in Formulae 1A and 1B, and $R_{11}$ to $R_{19}$ may be each independently selected from hydrogen, deuterium, —F, —Cl, —Br, —I, a cyano group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —O($O_1$), —S($Q_1$), and —Si($Q_1$)($O_2$)($Q_3$), wherein $Q_1$ to $Q_3$ may be each independently selected from a substituted or unsubstituted $C_1$-$C_{60}$ alkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In some embodiments, the organometallic compound represented by one of Formulae 1A and 1B may be represented by one of Formulae 1-11 and 1-12:

Formula 1-1

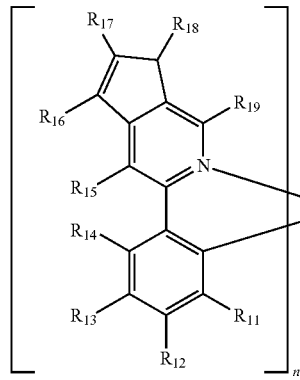

Formula 1-2

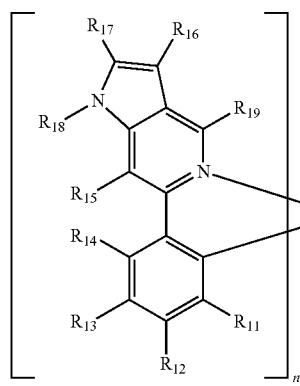

Formula 1-11

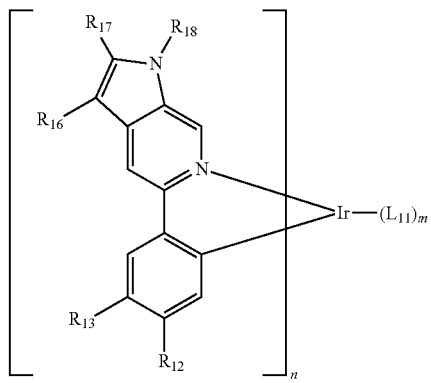

Formula 1-12

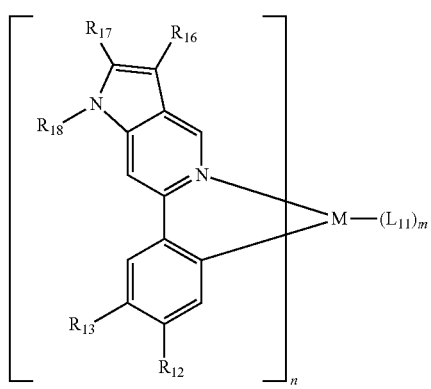

wherein, in Formulae 1-11 and 1-12, n, $L_{11}$, and m may be the same as those described in Formulae 1A and 1B, and $R_{12}$, $R_{13}$, and $R_{16}$ to $R_{18}$ may be each independently selected from hydrogen, deuterium, —F, —Cl, —Br, —I, a cyano group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —O($O_1$), —S($O_1$), and —Si($Q_1$)($Q_2$)($Q_3$), wherein $Q_1$ to $Q_3$ may be each independently selected from a substituted or unsubstituted $C_1$-$C_{60}$ alkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In some embodiments, the organometallic compound represented by one of Formulae 1A and 1B may be selected from Compounds 1 to 9:

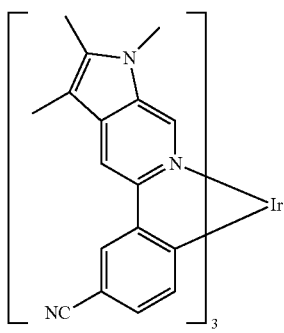

1

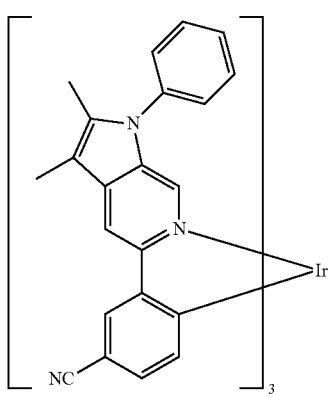

2

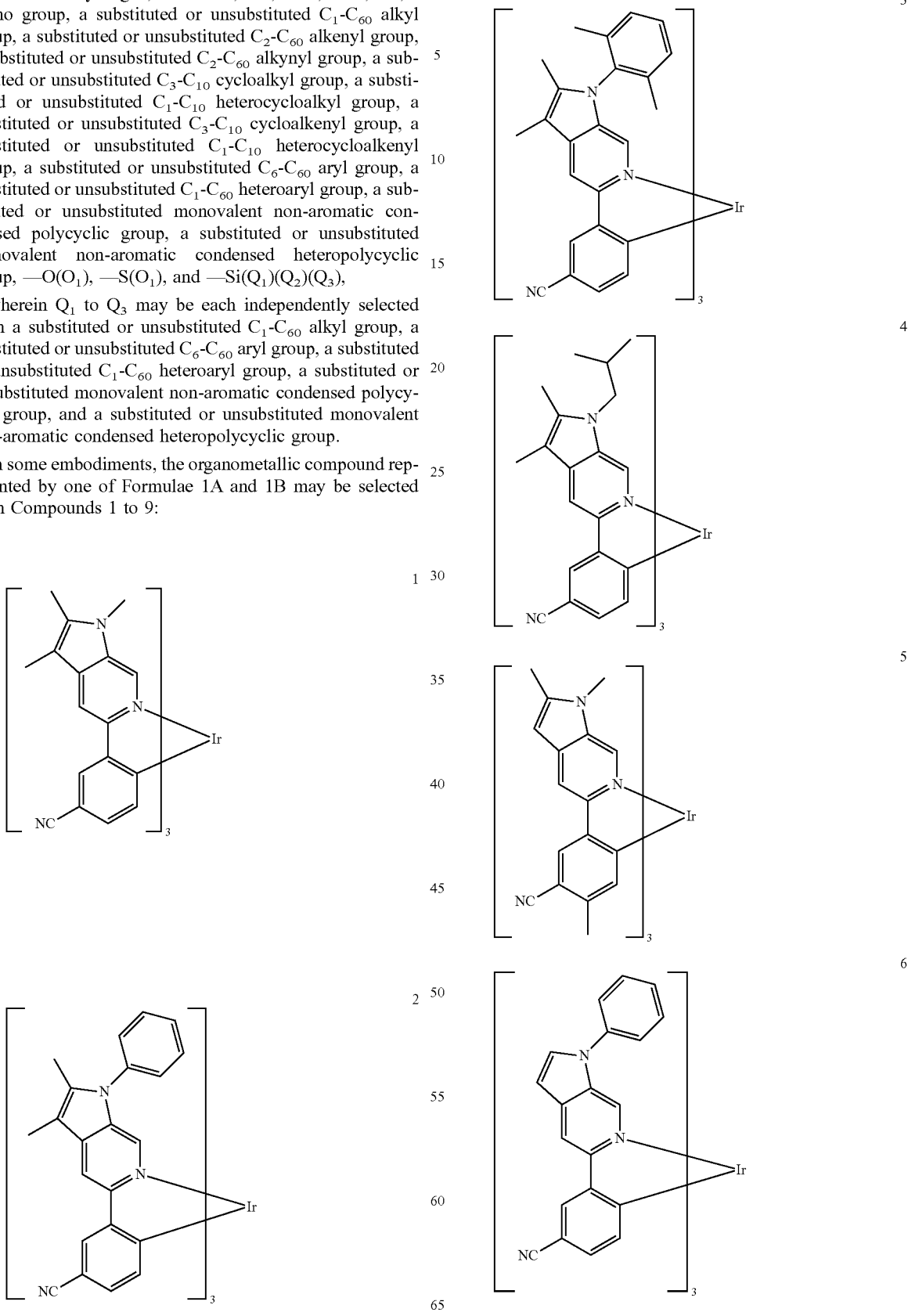

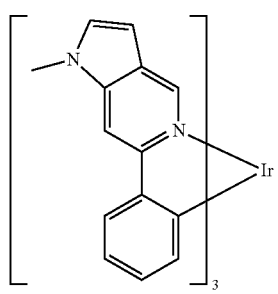

7

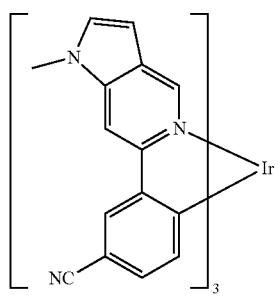

8

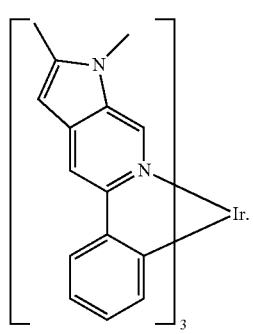

9

The maximum emission wavelength of the organometallic compound represented by one of Formulae 1A and 1B may be in a range of about 420 nanometers (nm) to about 490 nm or less, for example, about 440 nm to about 465 nm. While not wishing to be bound by theory, it is understood that when the maximum emission wavelength is 490 nm or less, the organic light-emitting device may provide a blue emission color. In some embodiments, when the maximum emission wavelength is 465 nm or less, the organic light-emitting device may provide a deep blue emission color.

In the organometallic compound represented by one of Formulae 1A and 1B, since a pyridine ring is condensed to a pyrrole ring, the thermal stability of the organometallic compound may improve.

In addition, since ring strain may occur in the organometallic compound represented by one of Formulae 1A and 1B, even without an additional electron withdrawing group, the emission color of the organometallic compound may be close to a blue color. An organic light-emitting device that includes the organometallic compound represented by one of Formulae 1A and 1B may exhibit improved color purity (blue emission) characteristics.

Furthermore, since the intermolecular interaction that may be generated in a compound that includes an electron withdrawing group may be suppressed, the deposition temperature of the organometallic compound represented by one of Formulae 1A and 1B may be less than that of an organometallic compound including an electron withdrawing group. With the decrease in deposition temperature, impurities may be formed less by pyrolysis, and thus, an organic light-emitting device including the organometallic compound represented by one of Formulae 1A and 1B may have improved efficiency and improved lifespan characteristics.

In some embodiments, the highest occupied molecular orbital (HOMO), the lowest unoccupied molecular orbital (LUMO), $S_1$ energy level, $T_1$ energy level, and spin density of some of the organometallic compounds represented by one of Formulae 1A and 1B were simulated by using the Gaussian. Simulation evaluation results are shown in Table 1.

TABLE 1

| Compound No. | HOMO (eV) | LUMO (eV) | $S_1$ (eV) | $S_1$ (nm) | $T_1$ (eV) | $T_1$ (nm) | Spin density |
|---|---|---|---|---|---|---|---|
| 1 | −5.18 | −1.40 | 3.14 | 395 | 2.81 | 441 | 0.203 |
| 2 | −5.15 | −1.37 | 3.15 | 394 | 2.81 | 441 | 0.209 |
| 3 | −5.18 | −1.38 | 3.16 | 392 | 2.85 | 436 | 0.249 |
| 4 | −5.51 | −1.72 | 3.13 | 396 | 2.83 | 438 | 0.145 |
| 5 | −5.11 | −1.38 | 3.10 | 401 | 2.82 | 440 | 0.180 |
| 7 | −4.33 | −0.77 | 2.96 | 419 | 2.60 | 478 | 0.176 |
| 8 | −5.26 | −1.49 | 3.18 | 390 | 2.70 | 460 | 0.118 |

The method of synthesizing the organometallic compound represented by one of Formulae 1A and 1B may be understood by one of ordinary skill in the art by referring to Synthesis Examples described herein.

Accordingly, the organometallic compound represented by one of Formulae 1A and 1B may be suitable for use in an organic layer of organic light-emitting device, for example, suitable as a dopant in an emission layer of the organic layer. According to another aspect, an organic light-emitting device may include:

a first electrode;

a second electrode; and an organic layer disposed between the first electrode and the second electrode, wherein the organic layer may include an emission layer at least one organometallic compound represented by one of Formulae 1A and 1B.

When the organic light-emitting device includes an organic layer including the organometallic compound represented by one of Formulae 1A and 1B, the organic light-emitting device may have improved efficiency, improved lifespan, and color purity.

The organometallic compound represented by one of Formulae 1A and 1B may be used in a pair of electrodes in an organic light-emitting device. In some embodiments, the organometallic compound represented by one of Formulae 1A and 1B may be included in the emission layer. Here, the organometallic compound may serve as a dopant, and the emission layer may further include a host. The emission layer may emit red light, green light, or blue light.

As used herein, the expression an "(organic layer) includes an organometallic compound" may be construed as meaning the "(organic layer) may include one organometallic compound represented by one of Formulae 1A and 1B or two different organometallic compounds represented by one of Formulae 1A and 1B".

In some embodiments, the organic layer may include, as the organometallic compound, only Compound 1. In this regard, Compound 1 may be included in an emission layer of the organic light-emitting device. In one or more embodiments, the organic layer may include, as the organometallic compound, Compound 1 and Compound 2. In this regard, Compounds 1 and 2 may be included in an identical layer (for example, Compound 1 and Compound 2 both may be included in an emission layer).

The first electrode may be an anode, which is a hole injection electrode, and the second electrode may be a cathode, which is an electron injection electrode, or the first electrode may be a cathode, which is an electron injection electrode, or the second electrode may be an anode, which is a hole injection electrode.

For example, the first electrode may be an anode, the second electrode may be a cathode, and the organic layer may include:

i) a hole transport region that is disposed between the first electrode and the emission layer, wherein the hole transport region may include at least one selected from a hole injection layer, a hole transport layer, and an electron blocking layer, and ii) an electron transport region that is disposed between the emission layer and the second electrode, wherein the electron transport region may include at least one selected from a hole blocking layer, an electron transport layer, and an electron injection layer.

The term "organic layer" as used herein refers to a single layer and/or a plurality of layers disposed between the first electrode and the second electrode of the organic light-emitting device. The "organic layer" may include, in addition to an organic compound, an organometallic complex including a metal.

FIG. 1 is a schematic view of an organic light-emitting device 10 according to an embodiment. Hereinafter, the structure of an organic light-emitting device according to an embodiment and a method of manufacturing an organic light-emitting device, according to an embodiment, will be described in connection with FIG. 1. The organic light-emitting device 10 includes a first electrode 11, an organic layer 15, and a second electrode 19, which are sequentially stacked in this stated order.

A substrate may be additionally disposed under the first electrode 11 or above the second electrode 19. Any substrate that is used in general organic light-emitting devices may be used as the substrate, and the substrate may be a glass substrate or a transparent plastic substrate, each having excellent mechanical strength, thermal stability, transparency, surface smoothness, ease of handling, and water-resistance.

In one or more embodiments, the first electrode 11 may be formed by depositing or sputtering a material for forming the first electrode 11 on the substrate. The first electrode 11 may be an anode. The material for forming the first electrode 11 may be selected from materials with a high work function to facilitate hole injection. The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), or zinc oxide (ZnO). In one or more embodiments, the material for forming the first electrode 11 may be a metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including two or more layers. For example, the first electrode 11 may have a three-layered structure of ITO/Ag/ITO, but the structure of the first electrode 11 is not limited thereto.

The organic layer 15 may be disposed on the first electrode 11.

The organic layer 15 may include a hole transport region, an emission layer, and an electron transport region.

The hole transport region may be disposed between the first electrode 11 and the emission layer.

The hole transport region may include at least one selected from a hole injection layer, a hole transport layer, an electron blocking layer, and a buffer layer.

The hole transport region may include either a hole injection layer or a hole transport layer. In one or more embodiments, the hole transport region may have a structure of hole injection layer/hole transport layer or hole injection layer/hole transport layer/electron blocking layer, which are sequentially stacked in this stated order from the first electrode 11.

When the hole transport region includes a hole injection layer, the hole injection layer may be formed on the first electrode 11 by using one or more suitable methods, for example, vacuum deposition, spin coating, casting, and/or Langmuir-Blodgett (LB) deposition.

When a hole injection layer is formed by vacuum deposition, the deposition conditions may vary depending on a material that is used to form the hole injection layer and the structure and thermal characteristics of the hole injection layer. In some embodiments, the deposition conditions may include a deposition temperature of about 100° C. to about 500° C., a vacuum pressure of about $10^{-8}$ torr to about $10^{-3}$ torr, and a deposition rate of about 0.01 Angstroms per second (Å/sec) to about 100 Å/sec. However, the deposition conditions are not limited thereto.

When the hole injection layer is formed using spin coating, coating conditions may vary depending on the material used to form the hole injection layer and the structure and thermal properties of the hole injection layer. For example, a coating speed may be from about 2,000 revolutions per minute (rpm) to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include at least one selected from m-MTDATA, TDATA, 2-TNATA, NPB, 8-NPB, TPD, Spiro-TPD, Spiro-NPB, methylated NPB, TAPC, HMTPD, 4,4',4''-tris(N-carbazolyl)triphenylamine (TCTA), polyaniline/dodecylbenzene sulfonic acid (PANI/DBSA), poly(3,4-ethylenedioxythiophene)/poly(4-styrene-sulfonate) (PEDOT/PSS), polyaniline/camphor sulfonic acid (PANI/CSA), polyaniline/poly(4-styrenesulfonate) (PANI/PSS), a compound represented by Formula 201 below, and a compound represented by Formula 202 below:

-continued
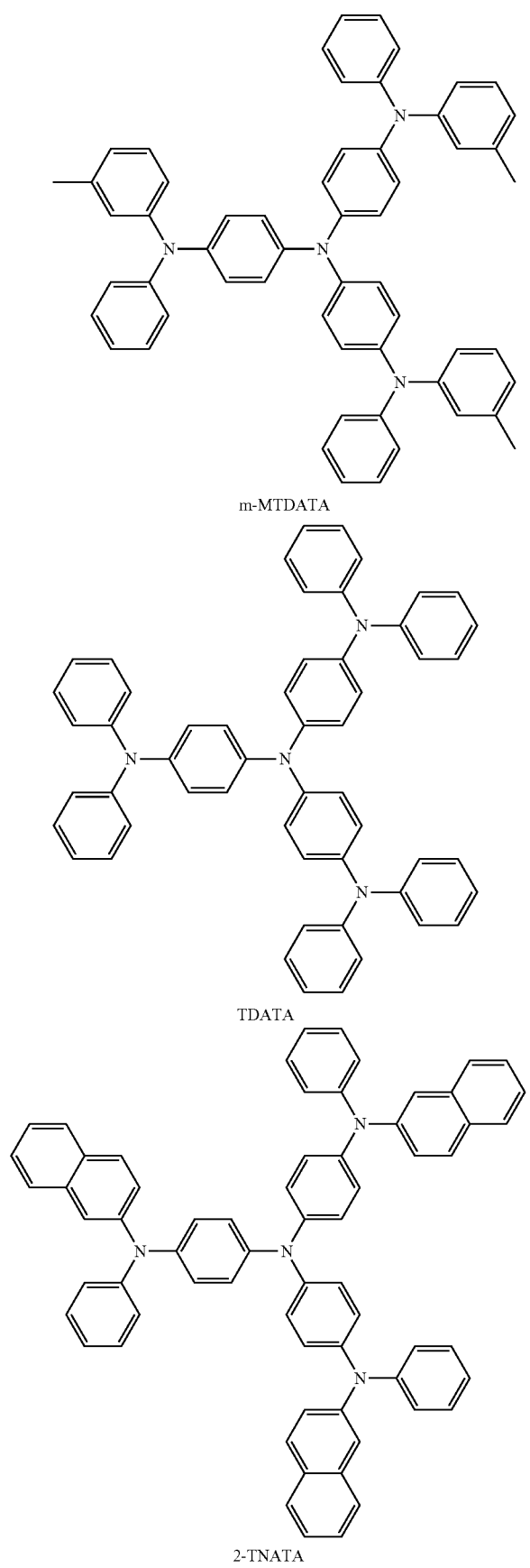
m-MTDATA
TDATA
2-TNATA
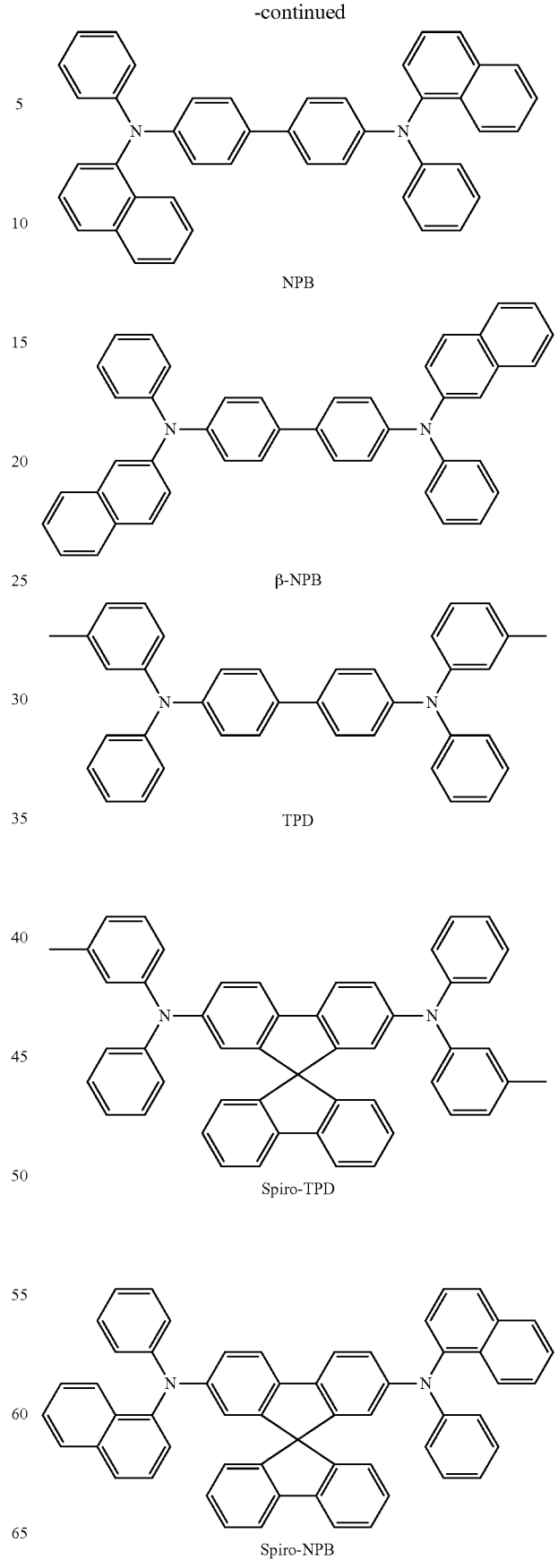
NPB
β-NPB
TPD
Spiro-TPD
Spiro-NPB -continued

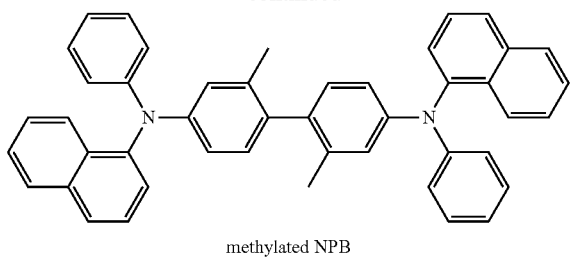

methylated NPB

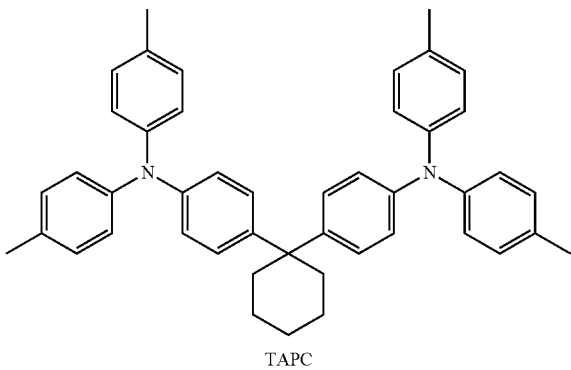

TAPC

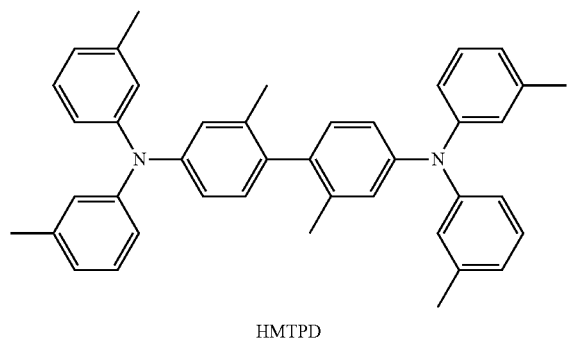

HMTPD

Formula 201

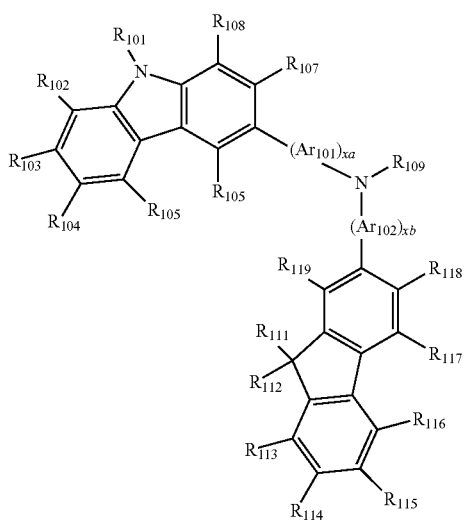

-continued

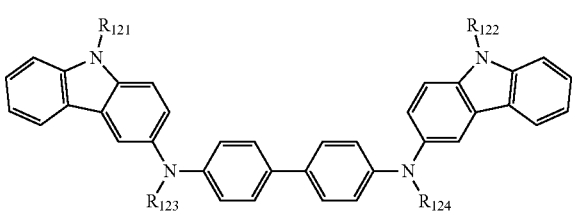

Formula 202 wherein $Ar_{101}$ and $Ar_{102}$ in Formula 201 may be each independently selected from a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_2$-$C_{10}$ heterocycloalkyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and a monovalent non-aromatic condensed heteropolycyclic group.

xa and xb in Formula 201 may be each independently an integer selected from 0 to 5. Alternatively, xa and xb may be each independently an integer selected from 0, 1, and 2. In some embodiments, xa may be 1 and xb may be 0, but embodiments are not limited thereto.

$R_{101}$ to $R_{108}$, $R_{111}$ to $R_{119}$, and $R_{121}$ to $R_{124}$ in Formulae 201 and 202 may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (e.g., a methyl group, an ethyl group, a propyl group, a butyl group, a pentyl group, or a hexyl group), and a $C_1$-$C_{10}$ alkoxy group (e.g., a methoxy group, an ethoxy group, a propoxy group, a butoxy group, or a pentoxy group);

a $C_1$-$C_{10}$ alkyl group and a $C_1$-$C_{10}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthracenyl group, a fluorenyl group, and a pyrenyl group; and a phenyl group, a naphthyl group, an anthracenyl group, a fluorenyl group, and a pyrenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group, but embodiments are not limited thereto.

$R_{109}$ in Formula 201 may be selected from a phenyl group, a naphthyl group, an anthracenyl group, and a pyridinyl group; and a phenyl group, a naphthyl group, an anthracenyl group, and a pyridinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, and a pyridinyl group.

In some embodiments, the compound represented by Formula 201 may be represented by Formula 201A, but embodiments are not limited thereto:

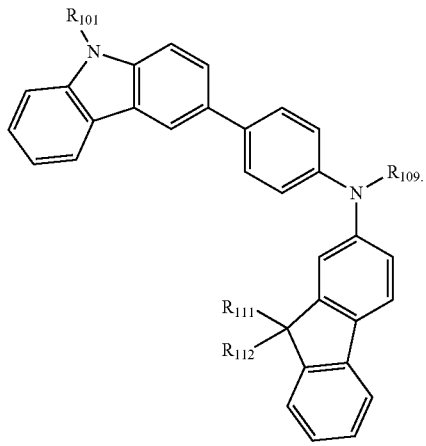

Formula 201A $R_{101}$, $R_{111}$, $R_{112}$, and $R_{109}$ in Formula 201A may be the same as those described herein.

In some embodiments, the compound represented by Formula 201 and the compound represented by Formula 202 may include Compounds HT1 to HT20, but embodiments are not limited thereto:

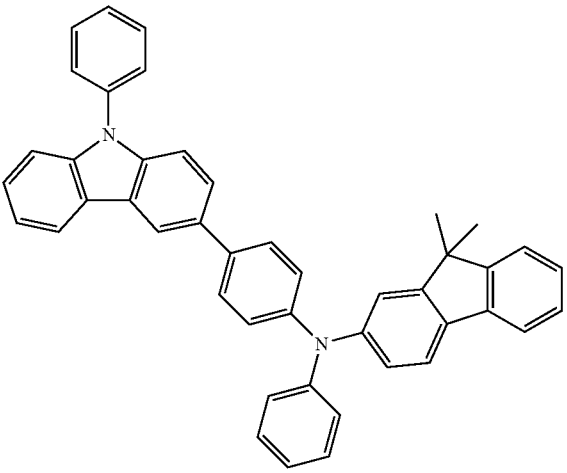

HT1

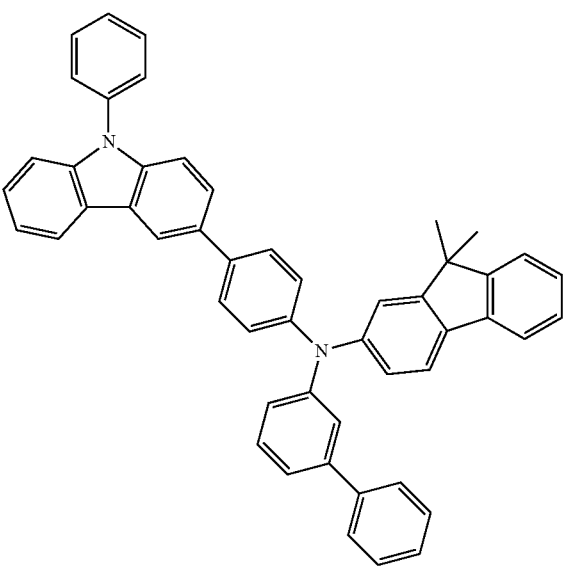

HT2

HT3
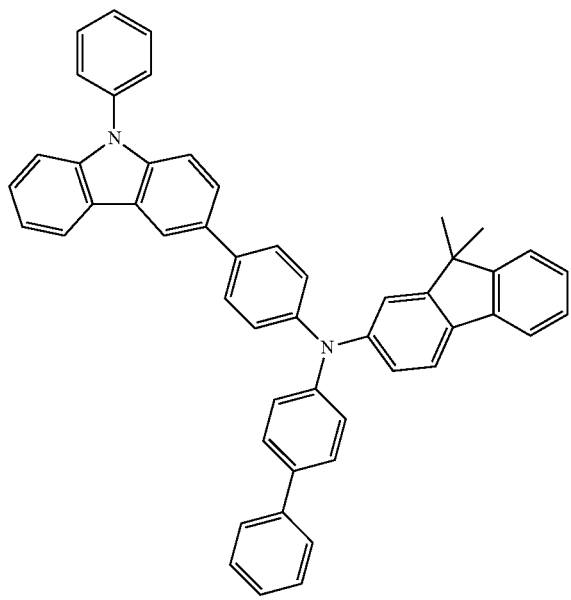
HT5
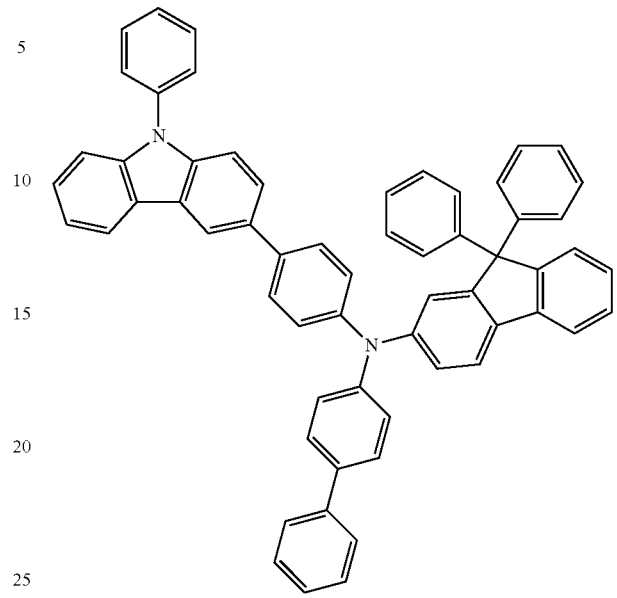
HT4
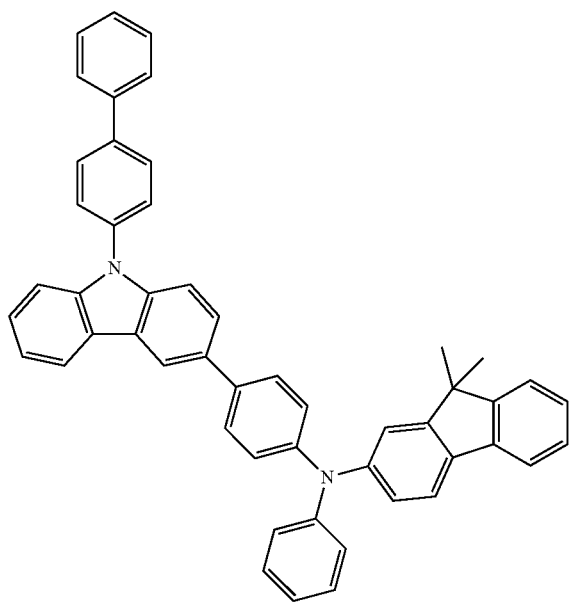
HT6
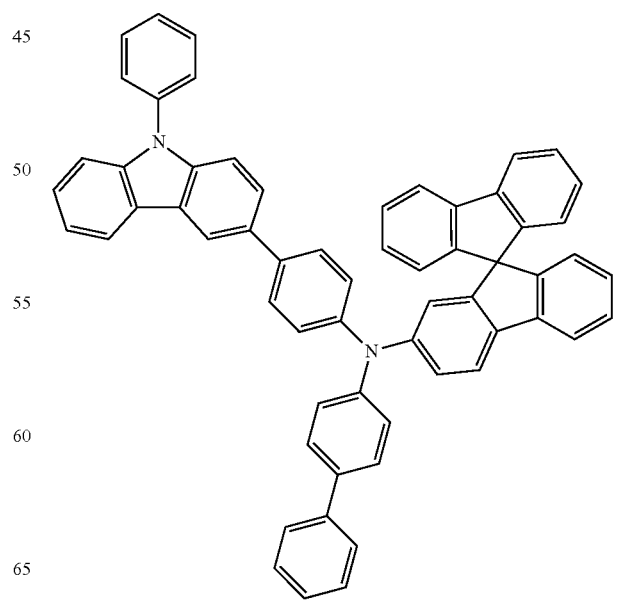

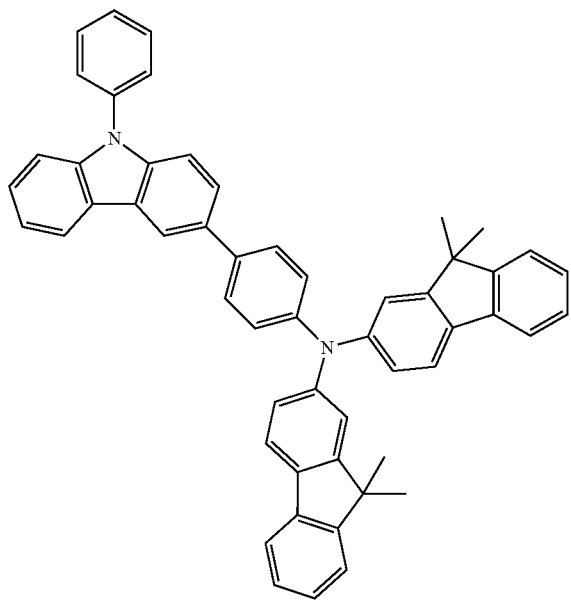
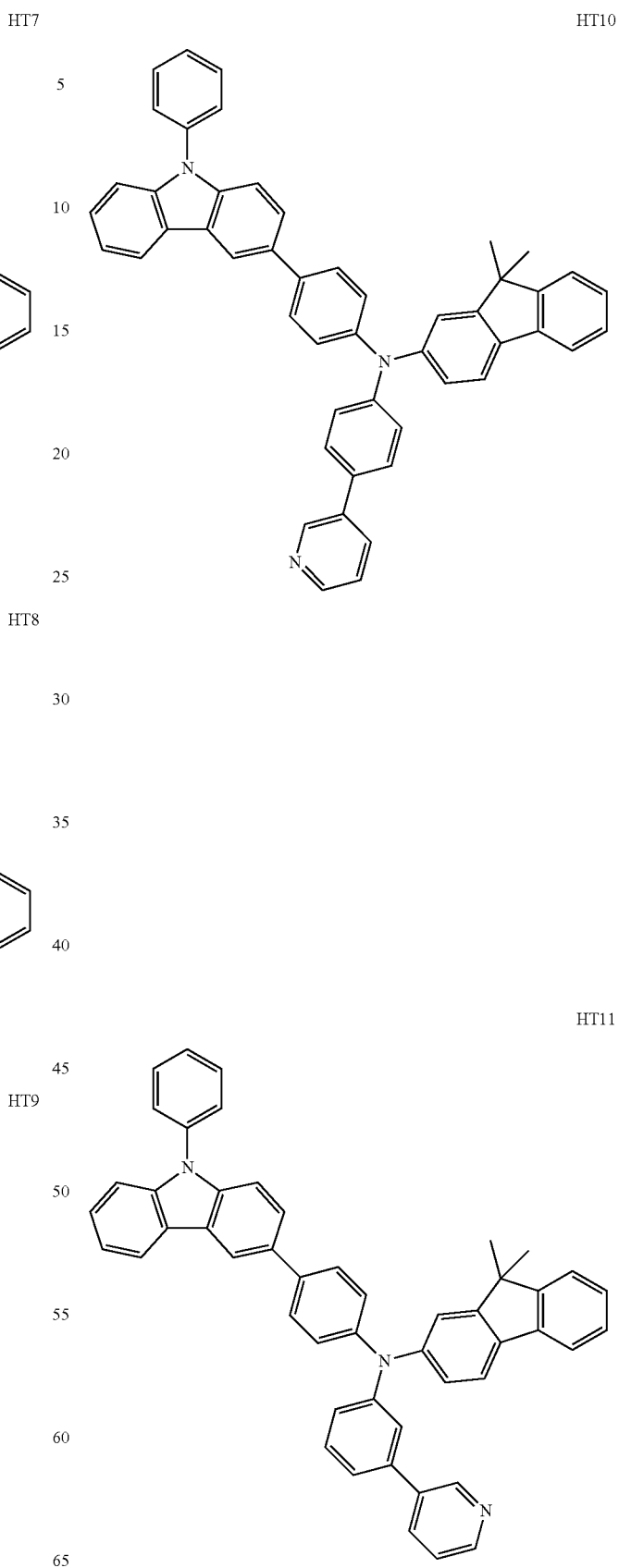

-continued
HT12
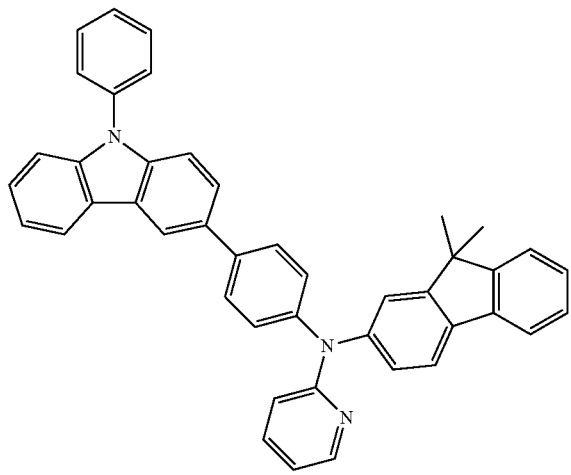
HT13
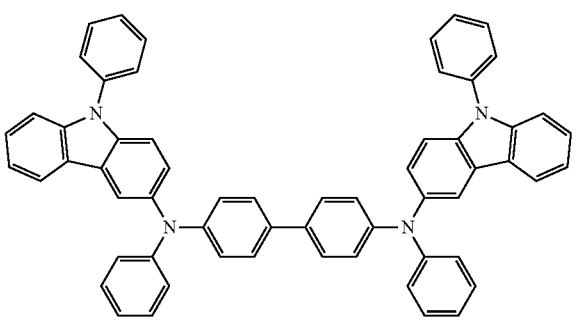
HT14
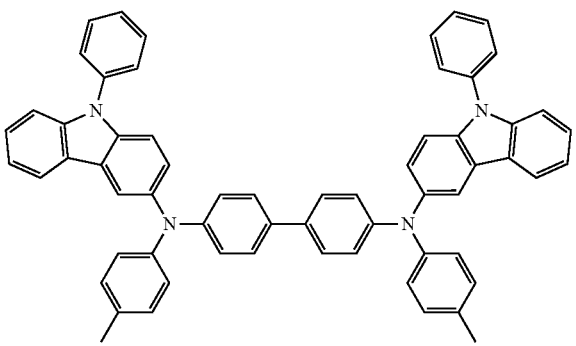
HT15
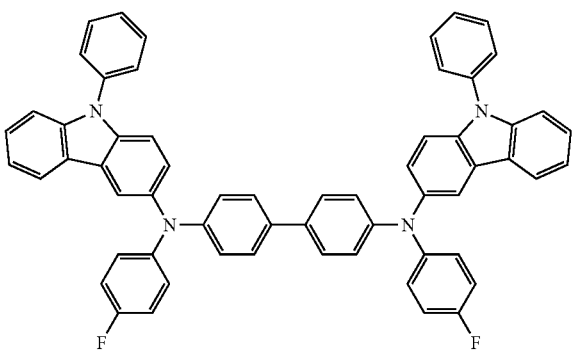
-continued
HT16
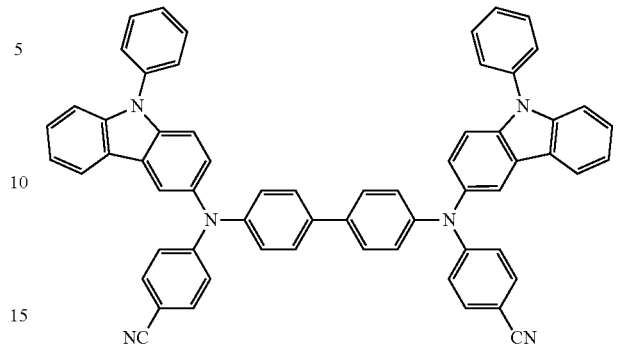
HT17
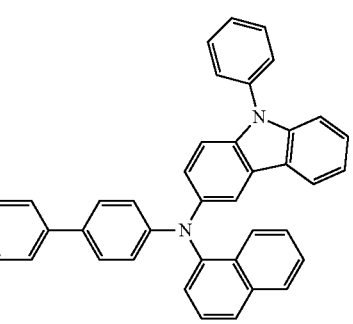
HT18
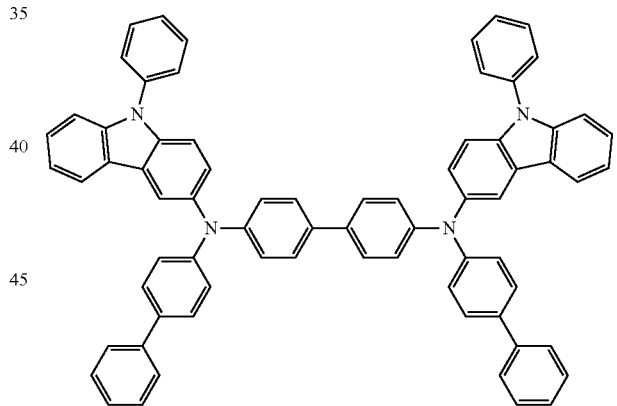
HT19
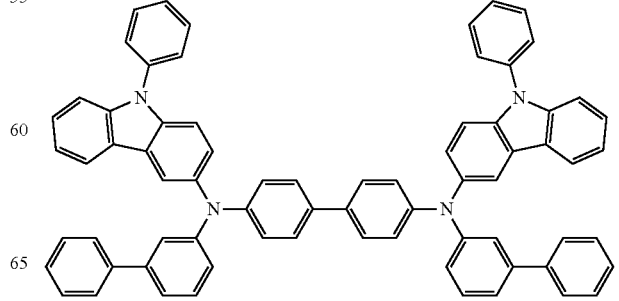

HT20

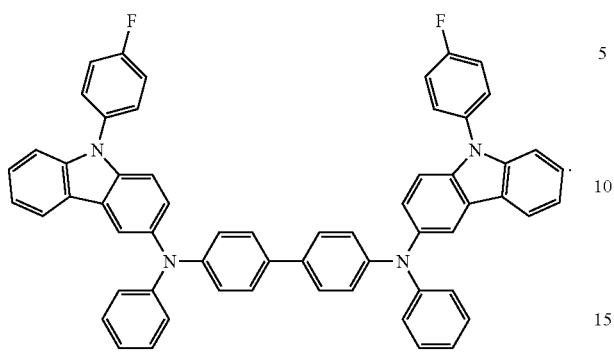

The thickness of the hole transport region may be in a range of about 100 Å to about 10,000 Å, for example, about 100 Å to about 1,000 Å. When the hole transport region includes both a hole injection layer and a hole transport layer, the thickness of the hole injection layer may be in a range of about 100 Å to about 10,000 Å, for example, about 100 Å to about 1,000 Å, and the thickness of the hole transport layer may be in a range of about 50 Å to about 2,000 Å, for example, about 100 Å to about 1,500 Å. While not wishing to be bound by theory, it is understood that when the thickness values of the hole transport region, the hole injection layer and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one selected from a quinone derivative, a metal oxide, and a cyano group-containing compound, but embodiments are not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenum oxide; and a cyano group-containing compound, such as Compound HT-D1 or Compound HT-D2 below, but are not limited thereto:

Compound HT-D1

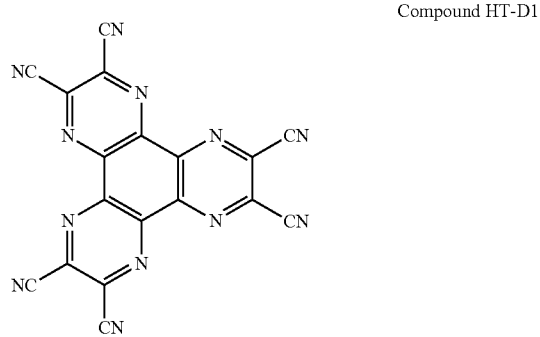

F4-TCNQ

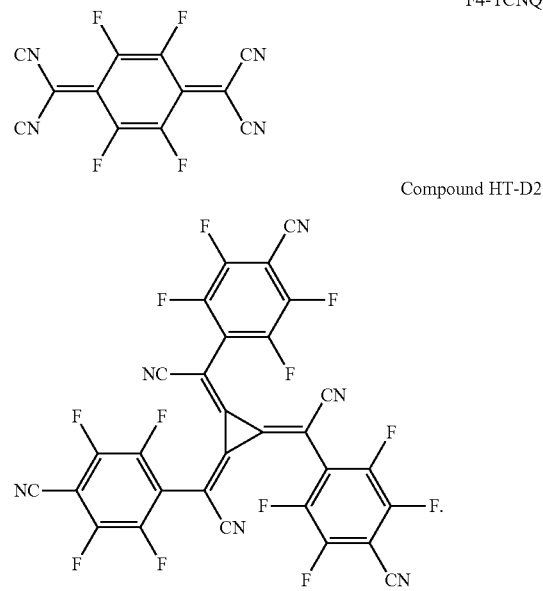

Compound HT-D2

The hole transport region may include a buffer layer.

Also, the buffer layer may compensate for an optical resonance distance according to a wavelength of light emitted from the emission layer, and thus, the efficiency of a formed organic light-emitting device may be improved.

Then, an emission layer may be formed on the hole transport region by vacuum deposition, spin coating, casting, LB deposition, or the like. When the emission layer is formed by vacuum deposition or spin coating, the deposition or coating conditions may be similar to those applied to form the hole injection layer although the deposition or coating conditions may vary depending on the material that is used to form the emission layer.

The emission layer may include a host and a dopant.

The host may include at least one selected from CBP, CDBP, TCP, and mCP:

CBP

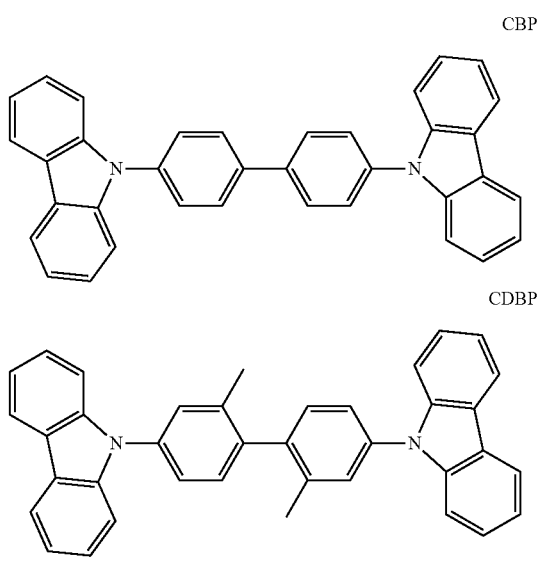

CDBP

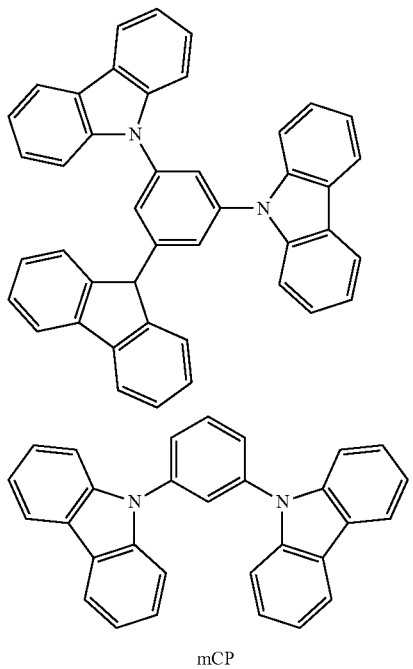

TCP

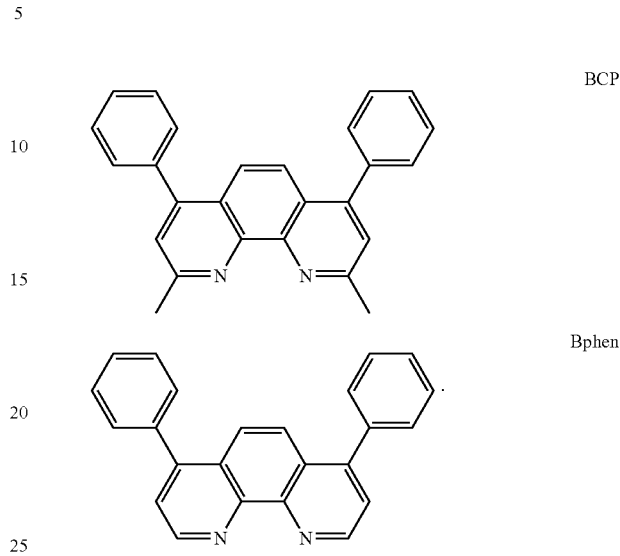

BCP

Bphen mCP

When the organic light-emitting device is a full color organic light-emitting device, the emission layer may be patterned into a red emission layer, a green emission layer, and a blue emission layer. In one or more embodiments, due to a stack structure including a red emission layer, a green emission layer, and/or a blue emission layer, the emission layer may emit white light.

The emission layer may include, as a dopant, the organometallic compound represented by one of Formulae 1A and 1B.

When the emission layer includes a host and a dopant, an amount of the dopant may be in a range of about 0.01 to about 20 parts by weight based on 100 parts by weight of the host, but is not limited thereto.

The thickness of the emission layer may be in a range of about 100 Å to about 1,000 Å, and in some embodiments, about 200 Å to about 600 Å. While not wishing to be bound by theory, it is understood that when the thickness of the emission layer is within these ranges, excellent light-emission characteristics may be obtained without a substantial increase in driving voltage.

Then, an electron transport region may be disposed on the emission layer.

The electron transport region may include at least one selected from a hole blocking layer, an electron transport layer, and an electron injection layer.

For example, the electron transport region may have a structure of hole blocking layer/electron transport layer/electron injection layer or a structure of electron transport layer/electron injection layer, but the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP and Bphen, but may also include other materials:

The thickness of the hole blocking layer may be in a range of about 20 Å to about 1,000 Å, for example, about 30 Å to about 300 Å. While not wishing to be bound by theory, it is understood that when the thickness of the hole blocking layer is within these ranges, the hole blocking layer may have excellent hole blocking characteristics without a substantial increase in driving voltage.

The electron transport layer may include at least one selected from BCP, Bphen, $Alq_3$, BAlq, TAZ, and NTAZ:

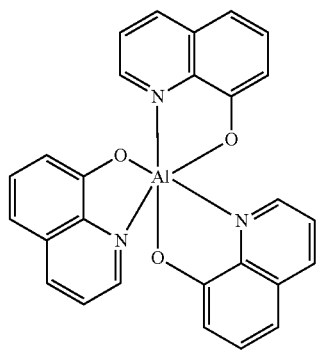

$Alq_3$

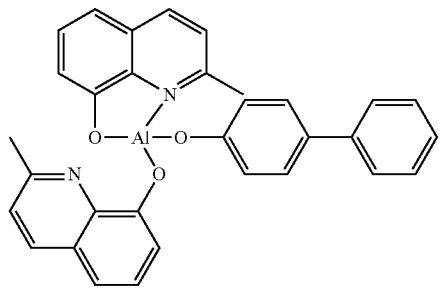

BAlQ

TAZ
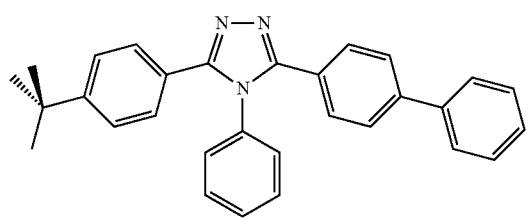
NTAZ
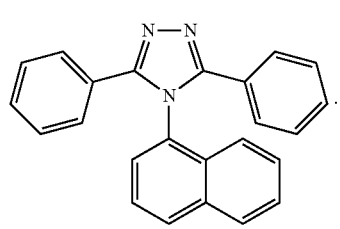
Alternatively, the electron transport layer may include at least one selected from Compounds ET1 to ET19, but embodiments are not limited thereto:
ET1
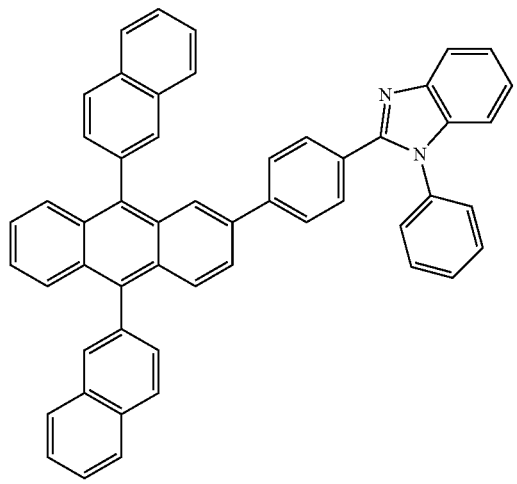
ET2
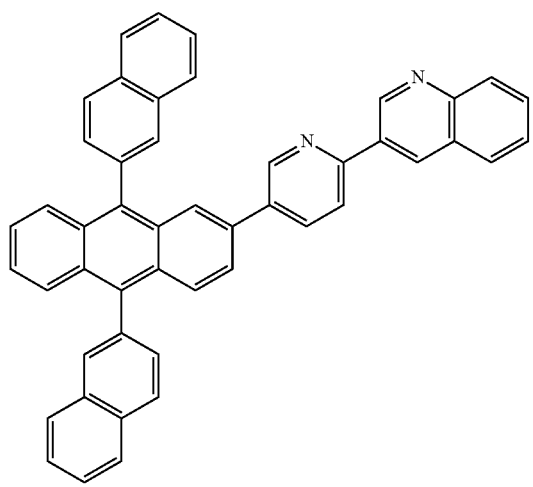
ET3
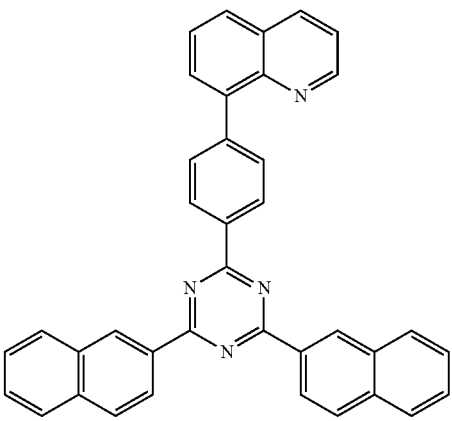
ET4
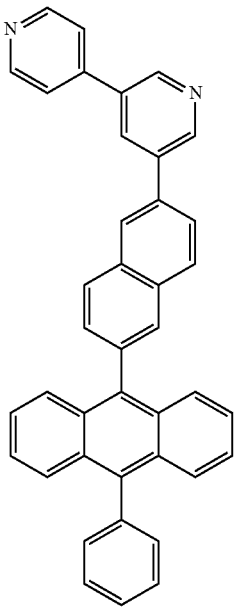
ET5
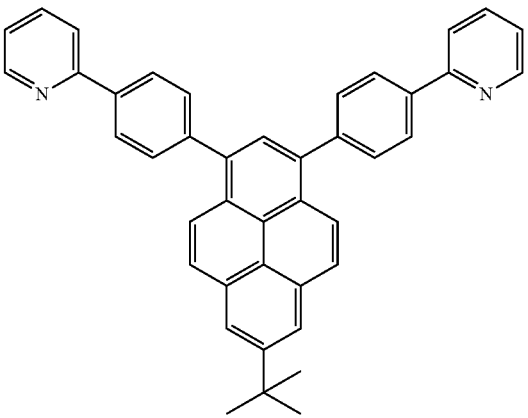

ET6
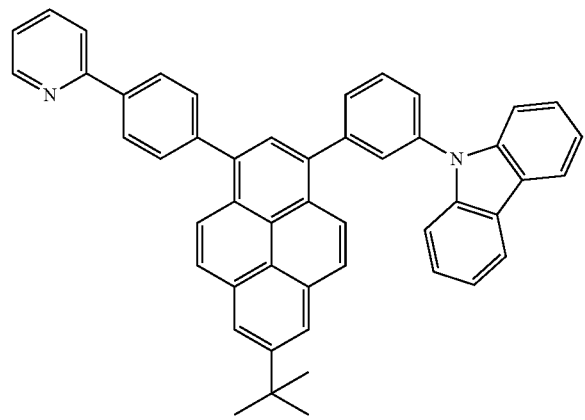
ET7
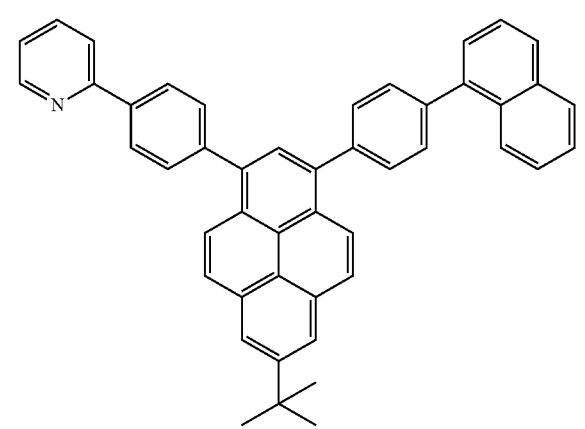
ET8
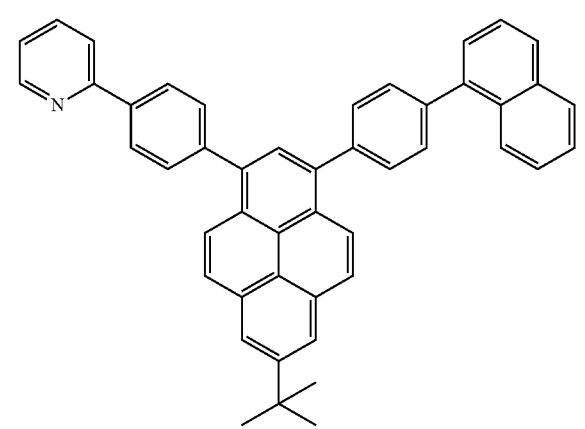
ET9
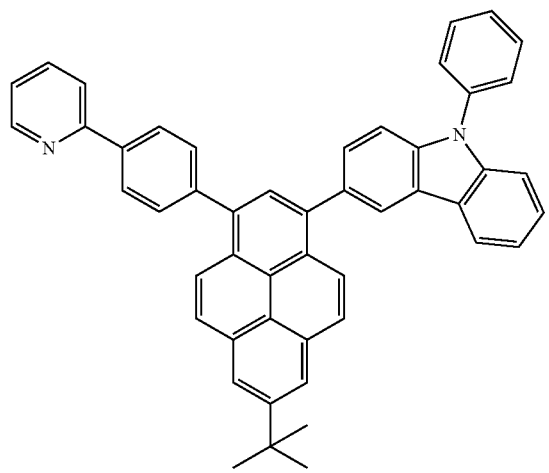
ET10
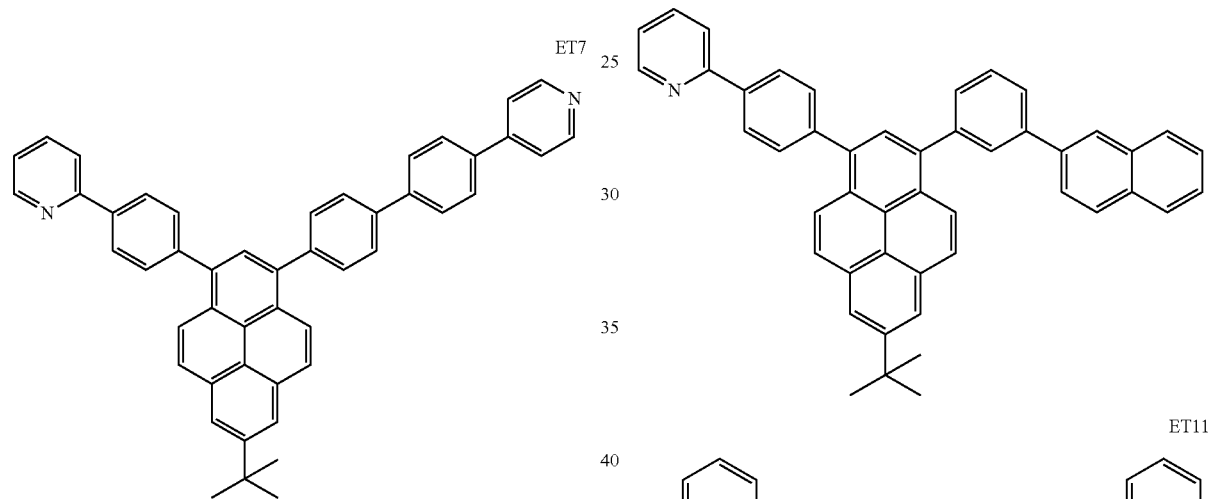
ET11
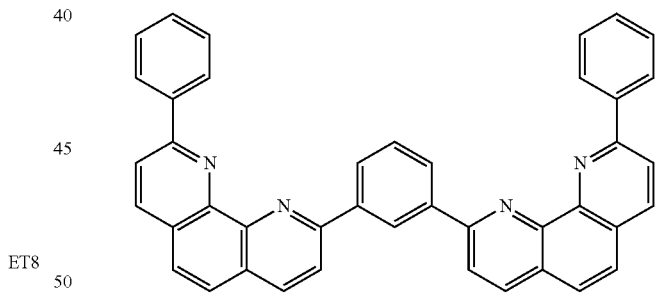
ET12
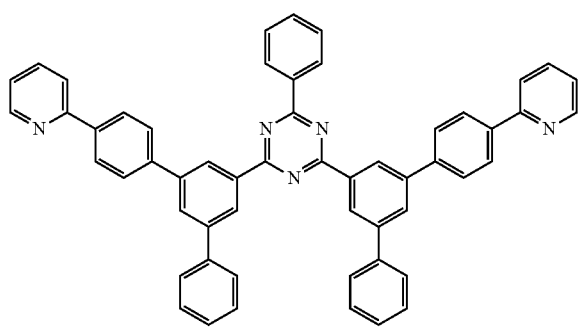

ET13
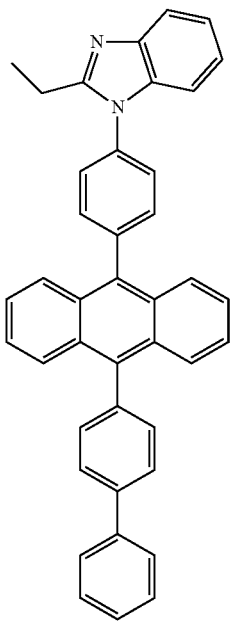
ET14
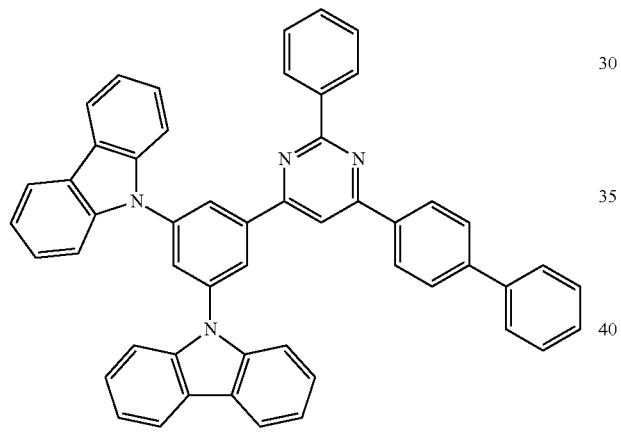
ET15
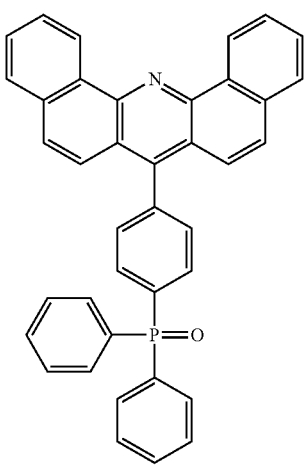
ET16
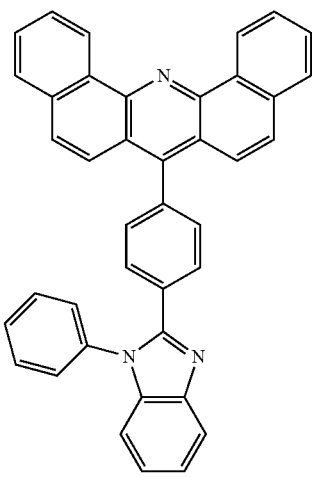
ET17
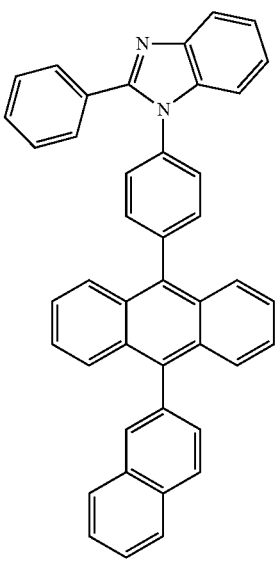
ET18
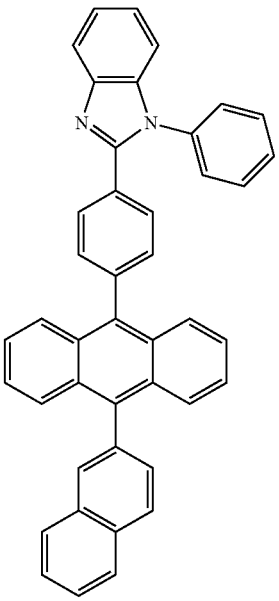

ET19

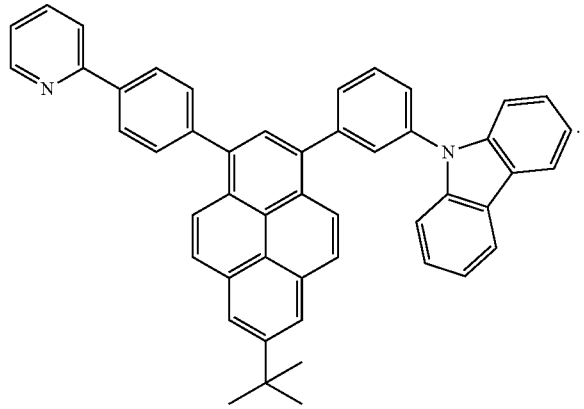

The thickness of the electron transport layer may be in a range of about 100 Å to about 1,000 Å, and in some embodiments, about 150 Å to about 500 Å. While not wishing to be bound by theory, it is understood that when the thickness of the electron transport layer is within these ranges, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (lithium quinolate, LiQ) or ET-D2:

ET-D1

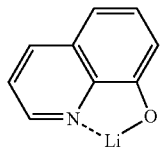

ET-D2

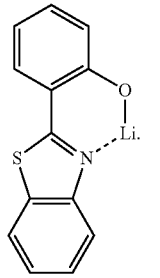

The electron transport region may include an electron injection layer that promotes a flow of electrons from the second electrode 19 thereinto.

The electron injection layer may include at least one selected from LiF, NaCl, CsF, $Li_2O$, BaO, and LiQ.

The thickness of the electron injection layer may be in a range of about 1 Å to about 100 Å, and in some embodiments, about 3 Å to about 90 Å. While not wishing to be bound by theory, it is understood that when the thickness of the electron injection layer is within these ranges, the electron injection layer may have satisfactory electron injection characteristics without a substantial increase in driving voltage.

The second electrode 19 may be disposed on the organic layer 15. The second electrode 19 may be a cathode. The material for forming the second electrode 19 may be metal, an alloy, an electrically conductive compound, and a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as the material for forming the second electrode 19. To manufacture a top emission type light-emitting device, a transmissive electrode formed using ITO or IZO may be used as the second electrode 19.

Hereinbefore, the organic light-emitting device has been described with reference to FIG. 1, but is not limited thereto.

The term "$C_1$-$C_{30}$ alkyl group" as used herein refers to a linear or branched saturated aliphatic hydrocarbon monovalent group having 1 to 60 carbon atoms. Examples thereof may include a methyl group, an ethyl group, a propyl group, an isobutyl group, a sec-butyl group, a tert-butyl group, a pentyl group, an iso-amyl group, and a hexyl group.

The term "$C_1$-$C_{30}$ alkoxy group" as used herein refers to a monovalent group represented by —$OA_{101}$ (wherein $A_{101}$ is the $C_1$-$C_{30}$ alkyl group). Examples thereof may include a methoxy group, an ethoxy group, and an iso-propyloxy (iso-propoxy) group.

The term "$C_2$-$C_{30}$ alkenyl group" as used herein refers to a hydrocarbon group having at least one carbon-carbon double bond in the middle or at the terminus of the $C_2$-$C_{30}$ alkyl group. Examples thereof may include an ethenyl group, a propenyl group, and a butenyl group.

The term "$C_2$-$C_{30}$ alkynyl group" as used herein refers to a hydrocarbon group having at least one carbon-carbon triple bond in the middle or at the terminus of the $C_2$-$C_{30}$ alkyl group. Examples thereof may include an ethynyl group and a propynyl group.

The term "$C_3$-$C_{10}$ cycloalkyl group" as used herein refers to a monovalent saturated hydrocarbon monocyclic group having 3 to 10 carbon atoms. Examples thereof may include a cyclopropyl group, a cyclobutyl group, a cyclopentyl group, a cyclohexyl group, and a cycloheptyl group.

The term "$C_1$-$C_{10}$ heterocycloalkyl group" as used herein refers to a monovalent saturated monocyclic group having at least one heteroatom selected from N, O, P, and S as a ring-forming atom and 1 to 10 carbon atoms. Examples thereof may include a tetrahydrofuranyl group and a tetrahydrothiophenyl group.

The term "$C_3$-$C_{10}$ cycloalkenyl group" as used herein refers to a monovalent monocyclic group that has 3 to 10 carbon atoms and at least one carbon-carbon double bond in the ring thereof, which is not aromatic. Examples thereof may include a cyclopentenyl group, a cyclohexenyl group, and a cycloheptenyl group.

The term "$C_1$-$C_{10}$ heterocycloalkenyl group" as used herein refers to a monovalent monocyclic group including at least one heteroatom selected from N, O, P, and S as a ring-forming atom, 1 to 10 carbon atoms, and at least one double bond in its ring. Detailed examples of the $C_1$-$C_{10}$ heterocycloalkenyl group may include a 2,3-dihydrofuranyl group and a 2,3-dihydrothiophenyl group.

The term "$C_6$-$C_{60}$ aryl group" as used herein refers to a monovalent group having a carbocyclic aromatic system having 6 to 60 carbon atoms. Detailed examples of the $C_6$-$C_{60}$ aryl group may include a phenyl group, a naphthyl group, an anthracenyl group, a phenanthrenyl group, a pyrenyl group, and a chrysenyl group. When the $C_6$-$C_{60}$ aryl group includes a plurality of rings, the rings may be fused.

The term "$C_6$-$C_{60}$ aryloxy group" as used herein refers to a monovalent group represented by —$OA_{101}$ (where $A_{101}$ is a $C_6$-$C_{60}$ aryl group). Detailed examples thereof may include a phenoxy group.

The term "$C_6$-$C_{60}$ arylthio group" as used herein refers to a monovalent group represented by —$SA_{101}$ (where $A_{101}$ is a $C_6$-$C_{60}$ aryl group). Detailed examples thereof may include a phenylthio group.

The term "$C_1$-$C_{60}$ heteroaryl group" as used herein refers to a monovalent heterocyclic aromatic system having at least one heteroatom selected from N, O, P, and S as a ring-forming atom and 1 to 60 carbon atoms. Examples of the $C_1$-$C_{60}$ heteroaryl group may include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group includes two or more rings, the rings may be fused to each other.

The term "monovalent non-aromatic condensed polycyclic group" as used herein refers to a monovalent group that has two or more rings condensed to each other, only carbon atoms as ring-forming atoms, and which is non-aromatic in the entire molecular structure. Examples of the monovalent non-aromatic condensed polycyclic group may include a fluorenyl group.

The term "monovalent non-aromatic condensed heteropolycyclic group" as used herein refers to a monovalent group that has two or more rings condensed to each other, a heteroatom selected from N, O, P, and S, in addition to carbon atoms as ring-forming atoms, and which is non-aromatic in the entire molecular structure. Examples of the monovalent non-aromatic condensed heteropolycyclic group may include a carbazolyl group.

The term "$C_5$-$C_{20}$ carbocyclic group" as used herein refers to an aliphatic group or an aromatic group that includes 5 to 20 carbon atoms. Examples of the $C_5$-$C_{20}$ carbocyclic group may include a cyclohexane, a cyclohexene, a benzene, and a naphthalene. When the $C_5$-$C_{20}$ carbocyclic group includes a plurality of rings, the rings may be fused.

At least one of substituents of the substituted $C_1$-$C_{30}$ alkyl group, substituted $C_2$-$C_{30}$ alkenyl group, substituted $C_2$-$C_{30}$ alkynyl group, substituted $C_1$-$C_{30}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{30}$ aryl group, substituted $C_6$-$C_{60}$ aryloxy group, substituted $C_6$-$C_{60}$ arylthio group, substituted $C_1$-$C_{30}$ heteroaryl group, substituted monovalent non-aromatic condensed polycyclic group, substituted monovalent non-aromatic condensed heteropolycyclic group, and substituted $C_5$-$C_{20}$ carbocyclic group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{30}$ alkyl group, a $C_2$-$C_{30}$ alkenyl group, a $C_2$-$C_{30}$ alkynyl group, and a $C_1$-$C_{30}$ alkoxy group;

a $C_1$-$C_{60}$ alkyl group, a $C_2$-$C_{30}$ alkenyl group, a $C_2$-$C_{30}$ alkynyl group, and a $C_1$-$C_{30}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{30}$ aryl group, a $C_6$-$C_{30}$ aryloxy group, a $C_6$-$C_{30}$ arylthio group, a $C_1$-$C_{30}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{30}$ aryl group, a $C_6$-$C_{30}$ aryloxy group, a $C_6$-$C_{30}$ arylthio group, a $C_1$-$C_{30}$ heteroaryl group, a monovalent non-aromatic condensed polycyclic group, and a monovalent non-aromatic condensed heteropolycyclic group; and a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{30}$ aryl group, a $C_6$-$C_{30}$ aryloxy group, a $C_6$-$C_{30}$ arylthio group, a $C_1$-$C_{30}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{30}$ alkyl group, a $C_2$-$C_{30}$ alkenyl group, a $C_2$-$C_{30}$ alkynyl group, a $C_1$-$C_{30}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{30}$ aryl group, a $C_6$-$C_{30}$ aryloxy group, a $C_6$-$C_{30}$ arylthio group, a $C_1$-$C_{30}$ heteroaryl group, a monovalent non-aromatic condensed polycyclic group, and a monovalent non-aromatic condensed heteropolycyclic group.

In some embodiments, at least one of substituents of the substituted $C_1$-$C_{30}$ alkyl group, substituted $C_2$-$C_{30}$ alkenyl group, substituted $C_2$-$C_{30}$ alkynyl group, substituted $C_1$-$C_{30}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{30}$ aryl group, substituted $C_6$-$C_{60}$ aryloxy group, substituted $C_6$-$C_{60}$ arylthio group, substituted $C_1$-$C_{30}$ heteroaryl group, substituted monovalent non-aromatic condensed polycyclic group, substituted monovalent non-aromatic condensed heteropolycyclic group, and substituted $C_5$-$C_{20}$ carbocyclic group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{30}$ alkyl group, a $C_2$-$C_{30}$ alkenyl group, a $C_2$-$C_{30}$ alkynyl group, and a $C_1$-$C_{30}$ alkoxy group;

a $C_1$-$C_{30}$ alkyl group, a $C_2$-$C_{30}$ alkenyl group, a $C_2$-$C_{30}$ alkynyl group, and a $C_1$-$C_{30}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{30}$ aryl group, a $C_6$-$C_{30}$ aryloxy group, a $C_6$-$C_{30}$ arylthio group, a $C_1$-$C_{30}$ heteroaryl group, a monovalent non-aromatic condensed polycyclic group, and a monovalent non-aromatic condensed heteropolycyclic group; a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoxazolyl group, a benzimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyrimidinyl group, and an imidazopyridinyl group, each substituted with at least one selected from a cyclopentyl group, a cyclohexyl group, a cycloheptyl group, a cyclooctyl group, a cyclopentenyl group, a cyclohexenyl group, a cycloheptenyl group, a phenyl group, a naphthyl group, an anthracenyl group, a pyrenyl group, a phenanthrenyl group, a fluorenyl group, a carbazolyl group, a benzocarbazolyl group, a dibenzocarbazolyl group, a pyridinyl group, a pyrimidinyl group, a pyrazinyl group, a pyridazinyl group, a triazinyl group, a quinolinyl group, an isoquinolinyl group, a phthalazinyl group, a quinoxalinyl group, a cinnolinyl group, and a quinazolinyl group; and a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoxazolyl group, a benzimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyrimidinyl group, and an imidazopyridinyl group, each substituted with at least one selected from a cyclopentyl group, a cyclohexyl group, a cycloheptyl group, a cyclooctyl group, a cyclopentenyl group, a cyclohexenyl group, a cycloheptenyl group, a phenyl group, a naphthyl group, an anthracenyl group, a pyrenyl group, a phenanthrenyl group, a fluorenyl group, a carbazolyl group, a benzocarbazolyl group, a dibenzocarbazolyl group, a pyridinyl group, a pyrimidinyl group, a pyrazinyl group, a pyridazinyl group, a triazinyl group, a quinolinyl group, an isoquinolinyl group, a phthalazinyl group, a quinoxalinyl group, a cinnolinyl group, and a quinazolinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{30}$ alkyl group, a $C_2$-$C_{30}$ alkenyl group, a $C_2$-$C_{30}$ alkynyl group, a $C_1$-$C_{30}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{30}$ aryl group, a $C_6$-$C_{30}$ aryloxy group, a $C_6$-$C_{30}$ arylthio group, a $C_1$-$C_{30}$ heteroaryl group, a monovalent non-aromatic condensed polycyclic group, and a monovalent non-aromatic condensed heteropolycyclic group.

When a group containing a specified number of carbon atoms is substituted with any of the groups listed in the preceding paragraphs, the number of carbon atoms in the resulting "substituted" group is defined as the sum of the carbon atoms contained in the original (unsubstituted) group and the carbon atoms (if any) contained in the substituent. For example, when the term "substituted $C_1$-$C_{60}$ alkyl" refers to a $C_1$-$C_{60}$ alkyl group substituted with $C_6$-$C_{60}$ aryl group, the total number of carbon atoms in the resulting aryl substituted alkyl group is $C_7$-$C_{120}$.

Hereinafter, an organic light-emitting device, according to an embodiment, will be described in more detail with reference to Synthesis Examples and Examples; however, the present disclosure is not limited thereto. The wording "B was used instead of A" used in describing Synthesis Examples means that an amount of B in molar equivalents used was identical to that amount of A.

EXAMPLE

Synthesis Example 1

Synthesis of Compound 5

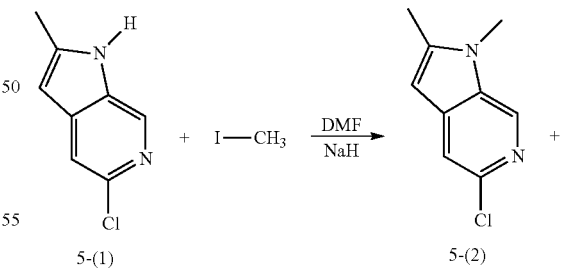

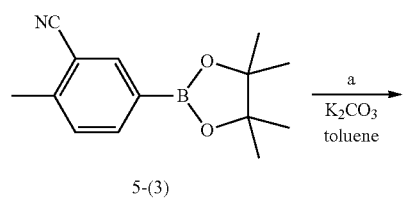

-continued

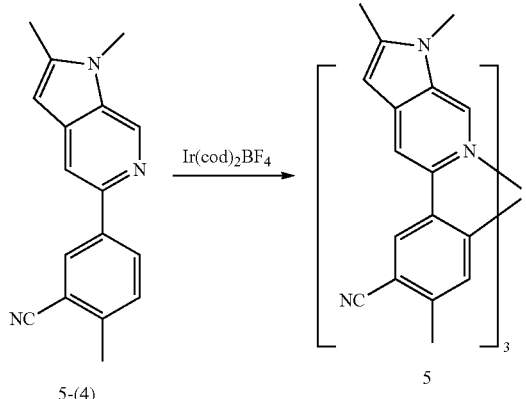

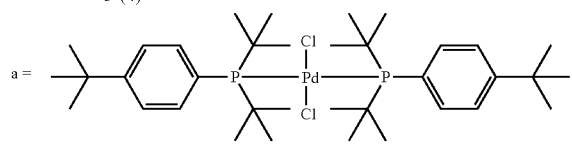

(1) Synthesis of Intermediate 5-(2)

To a 250 milliliters (mL) three-neck flask filled with nitrogen, 2 grams (g) (12 millimoles, mmol) of Compound 5-(1) and 40 mL of anhydrous dimethylformamide (DMF) were added. The obtained solution was cooled to a temperature of 0° C. NaH was added several times in small amounts to a total of 0.6 g (25 mmol) to the obtained solution under a nitrogen atmosphere, and the mixture was stirred for 1 hour at a temperature of 0° C. Methyl iodide was added dropwise thereto, and then the temperature was raised to ambient temperature, followed by 2-hour stirring. An aqueous solution of saturated sodium bicarbonate was added thereto. Subsequently, an organic layer was extracted by using ethyl acetate. The obtained organic layer was dried by using anhydrous magnesium sulfate and evaporated under reduced pressure to obtain a crude compound. The obtained crude compound was purified by using silica gel column chromatography using dichloromethane and ethyl acetate at a volume ratio of 2:3, thereby obtaining 1.18 g (6.56 mmol) of Intermediate 5-(2) (yield: 54%). The obtained Intermediate 5-(2) was identified by using $^1$H-nuclear magnetic resonance (NMR).

$^1$H-NMR δ (ppm): 8.35 (1H, s), 7.36 (1H, s), 6.19 (1H, s), 3.71 (3H, s), 2.43 (3H, s).

(2) Synthesis of Intermediate 5-(4)

To a two-neck flask, 8.68 g (48.1 mmol) of Intermediate 5-(2), 1.703 g (2.41 mmol) of Compound a, 97 g (105.8 mmol, 2.2 equivalents, eq) of potassium carbonate, and 14.03 g (57.72 mmol) of Compound 5-(3) were added and the interior of the flask was purged with nitrogen. 170 milliliters (ml) of toluene and 2 ml of water were added to the two-neck flask, and the mixture was stirred at a temperature of 100° C. for 17 hours. The reaction mixture was cooled to ambient temperature, water and toluene were removed therefrom, and dichloromethane was added thereto. The mixture was sequentially washed with a saturated sodium bicarbonate aqueous solution, water, and a saturated sodium chloride aqueous solution. The organic layer was separated from the aqueous layer. The obtained organic layer was dried by using anhydrous magnesium sulfate, and evaporated under reduced pressure to obtain a crude compound. The obtained crude compound was purified by using silica gel column chromatography using dichloromethane and ethyl acetate at a volume ratio of 2:3, thereby obtaining 7.416 g (28.38 mmol) of Intermediate 5-(4) (yield: 59%). The obtained Intermediate 5-(4) was identified by using $^1$H-NMR.

$^1$H-NMR δ (ppm): 8.71 (1H, s), 8.27 (1H, d, Hz=0.9), 8.13 (1H, d, Hz=3.00, dd, Hz=2.1), 7.81 (1H, s), 7.38 (1H, dd, Hz=4.2), 3.80 (3H, s), 2.58 (3H, s), 2.48 (3H, s).

(3) Synthesis of Compound 5

2.52 g (9.7 mmol) of Intermediate 5-(4), 1.20 g (2.4 mmol) of Ir(cod)$_3$BF$_4$, and 20 mL of N-methyl-2-pyrrolidone (NMP) were added to a microwave reaction vessel, and the microwave reaction vessel was filled with nitrogen, followed by irradiating microwave thereon at a temperature of 180° C. for 30 minutes. The reaction mixture was added to 10% ammonia water. The mixture was stirred, and an organic layer was obtained, and then sequentially washed with a saturated sodium bicarbonate aqueous solution, water, and a saturated sodium chloride aqueous solution. The organic layer was separated from the aqueous layer. The obtained organic layer was dried by using anhydrous magnesium sulfate and evaporated under reduced pressure to obtain a crude compound. The obtained crude compound was purified by silica gel column chromatography using dichloromethane only, thereby obtaining 0.79 g (0.72 mmol) of Intermediate 5-(2) (yield: 30%).

$^1$H-NMR δ (ppm): 8.04 (1H, s), 7.83 (1H, s), 7.41 (1H, s), 6.77 (1H, s), 6.36 (1H, s) 3.26 (1H, s), 2.38 (3H, s), 2.23 (3H, s).

Synthesis Example 2: Synthesis of Compound 4

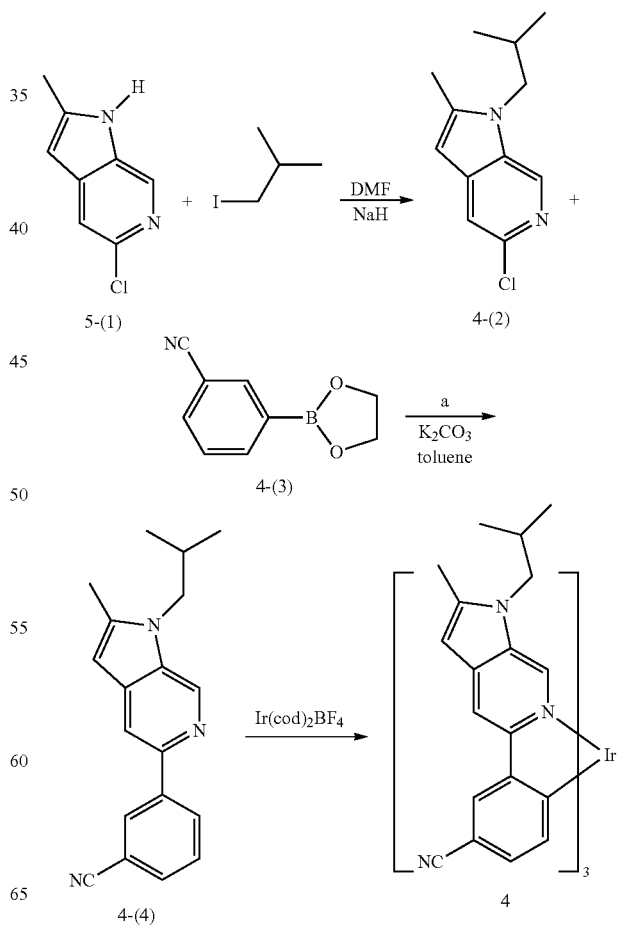

a = 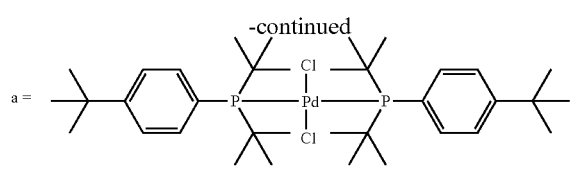

a = 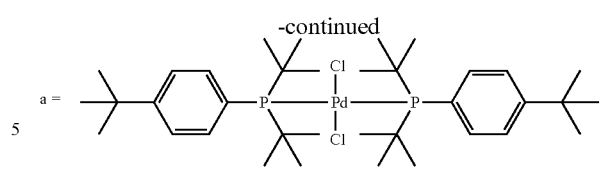

(1) Synthesis of Intermediate 4-(2)

3.20 g (6.56 mmol) of Intermediate 4-(2) was obtained in the same manner as in Synthesis of Intermediate 5-(2), except that 1-iodo-2-methylpropane was used in place of methyl iodide (yield: 25%). The obtained Intermediate 4-(2) was identified by using $^1$H-NMR.

$^1$H-NMR δ (ppm): 8.35 (1H, s), 7.39 (1H, s), 6.20 (1H, s), 3.90 (3H, s), 2.44 (3H, s,), 2.14 (1H, m), 0.85 (6H, s).

(2) Synthesis of Intermediate 4-(4)

7.416 g (28.38 mmol) of Intermediate 4-(4) was obtained in the same manner as in Synthesis of Intermediate 5-(4), except that Compound 4-(3) was used in place of Compound 5-(3) (yield: 59%). The obtained Intermediate 4-(4) was identified by using $^1$H-NMR.

$^1$H-NMR δ (ppm): 8.71 (1H, s), 8.27 (1H, d, Hz=0.9), 8.13 (1H, d, Hz=3.00, dd, Hz=2.1), 7.81 (1H, s), 7.38 (1H, dd, Hz=4.2), 3.80 (3H, s), 2.58 (3H, s), 2.48 3H, s).

(3) Synthesis of Compound 4

0.79 g (0.72 mmol) of Compound 4 was obtained in the same manner as in Synthesis of Compound 5, except that Intermediate 4-(4) was used in place of Intermediate 5-(4) (yield: 30%).

Synthesis Example 3

Synthesis of Compound 9

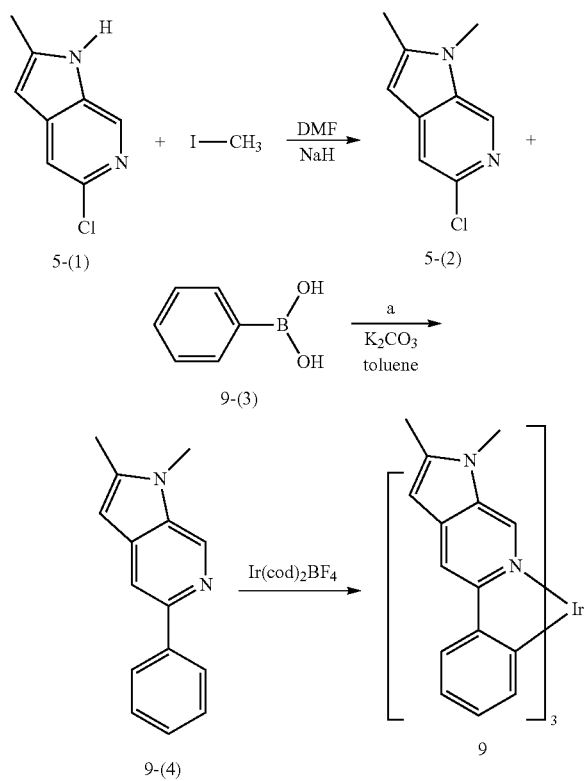

(1) Synthesis of Intermediate 9-(4)

4.20 g (18 mmol) of Intermediate 9-(4) was obtained in the same manner as in Synthesis of Intermediate 5-(4), except that Compound 9-(3) was used in place of Compound 5-(3) (yield: 55%). The obtained Intermediate 4-(4) was identified by using $^1$H-NMR.

$^1$H-NMR δ (ppm): 8.71 (1H, s), 8.27 (1H, d, Hz=0.9), 8.13 (1H, d, Hz=3.00, dd, Hz=2.1), 7.81 (1H, s), 7.38 (1H, dd, Hz=4.2), 3.80 (3H, s), 2.58 (3H, s), 2.48 3H, s).

(2) Synthesis of Compound 9

0.79 g (0.72 mmol) of Compound 9 was obtained in the same manner as in Synthesis of Compound 5, except that Intermediate 9-(4) was used in place of Intermediate 5-(4) (yield: 30%).

$^1$H-NMR δ (ppm): 8.04 (1H, s), 7.83 (1H, s), 7.41 (1H, s), 6.77 (1H, s), 6.36 (1H, s) 3.26 (1H, s), 2.38 (3H, s), 2.23 (3H, s).

Evaluation Example 1

Emission Spectrum Evaluation

Figure 2:
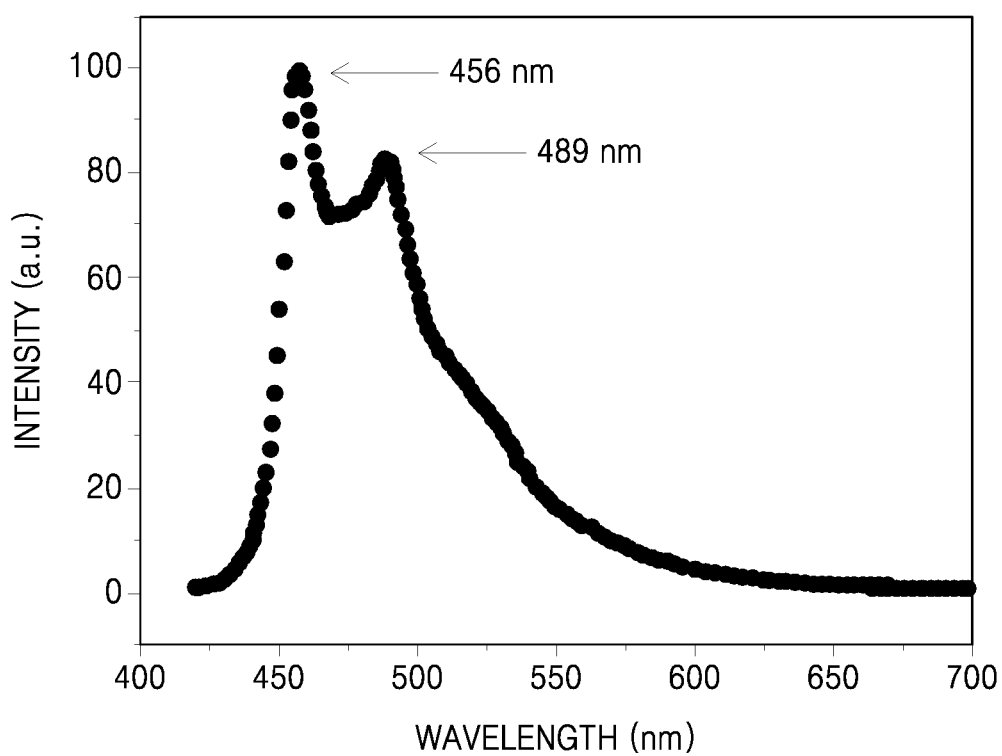
FIG. 2 is a graph of intensity (arbitrary units, a. u.) versus wavelength (nanometers, nm) illustrating a photoluminescence (PL) spectrum of Compound 5.

The photoluminescence (PL) spectra of Compounds 5 and 6 were measured to evaluate emission characteristics of each compound. Compound 5 was dissolved at a concentration of 10 millimolar (mM) in $CH_2Cl_2$, and then an ISC PC1 spectrofluorometer, in which a Xenon lamp was mounted, was used to measure a PL spectrum of Compound 5 at room temperature. The same process was performed on Compound 6, thereby evaluating the PL spectra of Compounds 5 and 6. The results thereof are shown in Table 2. In addition, as an example, the PL spectrum of Compound 5 is shown in FIG. 2.

TABLE 2

| Compound No. | $\lambda_{max}$ (nm) | T1 (eV) | CIE color-coordinate |
|---|---|---|---|
| 5 | 456, 489 | 2.72 | (0.16, 0.26) |
| 6 | 472 | 2.63 | (0.17, 0.35) |

Referring to Table 2, it was found that the Compounds 5 and 6 exhibited excellent emission characteristics.

As described above, an organometallic compound, according to one or more embodiments, has excellent optical characteristics, electrical characteristics, and thermal stability. Accordingly, an organic light-emitting device using the organometallic compound may have improved efficiency, improved lifespan, and color purity characteristics.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present disclosure as defined by the following claims.

What is claimed is:

1. An organometallic compound represented by one of Formulae 1A and 1B:

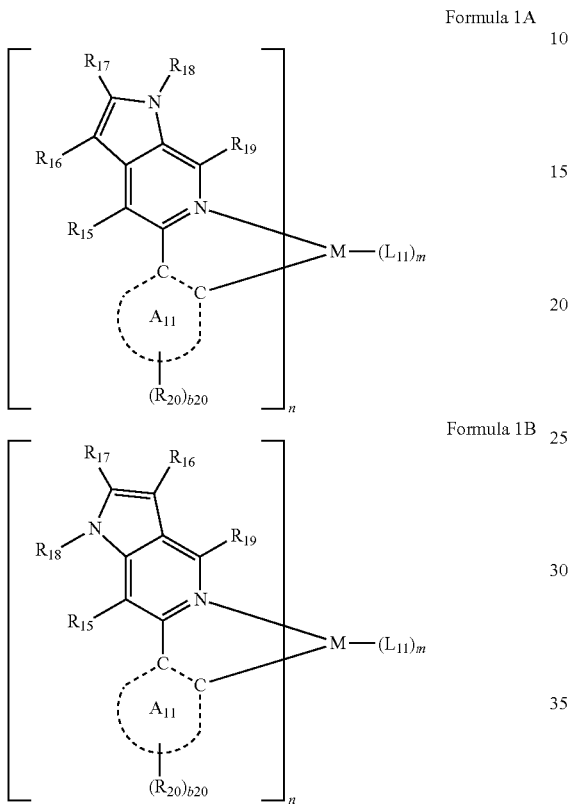

wherein, in Formulae 1A and 1B,

M is selected from M is selected from iridium (Ir), platinum (Pt), osmium (Os), ruthenium (Ru), rhodium (Rh), palladium (Pd), copper (Cu), silver (Ag), gold (Au), titanium (Ti), zirconium (Zr), hafnium (Hf), europium (Eu), terbium (Tb), and thulium (Tm), $A_{11}$ is selected from a $C_5$-$C_{20}$ carbocyclic group, $R_{15}$ and $R_{18}$ to $R_{20}$ are each independently selected from hydrogen, deuterium, —F, —Cl, —Br, —I, a cyano group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —O($Q_1$), —S($Q_1$), and —Si($Q_1$)($Q_2$)($Q_3$), wherein $Q_1$ to $Q_3$ are each independently selected from a substituted or unsubstituted $C_1$-$C_{60}$ alkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, $R_{16}$ and $R_{17}$ are each independently selected from hydrogen, deuterium, —F, —Cl, —Br, —I, a cyano group, a substituted or unsubstituted $C_2$-$C_{60}$ alkenyl group, a substituted or unsubstituted $C_2$-$C_{60}$ alkynyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —O($Q_1$), —S($Q_1$), and —Si($Q_1$)($Q_2$)($Q_3$), wherein $Q_1$ to $Q_3$ are each independently selected from a substituted or unsubstituted $C_1$-$C_{60}$ alkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, $R_{16}$ and $R_{17}$ are optionally bound via $Y_{11}$ to form a ring, $Y_{11}$ is a substituted or unsubstituted $C_1$-$C_5$ alkylene group, b20 is selected from 1, 2, 3, 4, 5, and 6, n is selected from 1, 2, and 3, $L_{11}$ is selected from a monodentate ligand and a bidentate ligand, and m is selected from 0, 1, 2, 3, and 4.

2. The organometallic compound of claim 1, wherein M is selected from Ir, Pt, and Os.

3. The organometallic compound of claim 1, wherein M is Ir.

4. The organometallic compound of claim 1, wherein $A_{11}$ is selected from a benzene group, a naphthalene group, a phenanthrene group, an anthracene group, a triphenylene group, a pyrene group, and a chrysene group.

5. The organometallic compound of claim 1, wherein $A_{11}$ is selected from a benzene group and a naphthalene group.

6. The organometallic compound of claim 1, wherein $A_{11}$ is a benzene group.

7. The organometallic compound of claim 1, wherein $R_{15}$ and $R_{18}$ to $R_{20}$ are each independently selected from hydrogen, deuterium, —F, —Cl, —Br, —I, a cyano group, a substituted or unsubstituted $C_1$-$C_{60}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —O($Q_1$), —S($Q_1$), and —Si($Q_1$)($Q_2$)($Q_3$), wherein $Q_1$ to $Q_3$ are each independently selected from a substituted or unsubstituted $C_1$-$C_{60}$ alkyl group, a substituted or unsubstituted $C_6$-$C_{60}$ aryl group, and a substituted or unsubstituted $C_1$-$C_{60}$ heteroaryl group, $R_{16}$ and $R_{17}$ are each independently selected from hydrogen, deuterium, —F, —Cl, —Br, —I, a cyano group, a substituted or unsubstituted $C_1$-$C_{10}$ heterocycloalkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —O($Q_1$), —S($Q_1$), and —Si($Q_1$)($Q_2$)($Q_3$), wherein $Q_1$ to $Q_3$ are each independently selected from a substituted or unsubstituted $C_1$-$C_{60}$ alkyl group, a substituted or unsubstituted $C_6$-$C_{60}$ aryl group, and a substituted or unsubstituted $C_1$-$C_{60}$ heteroaryl group, and $R_{16}$ and $R_{17}$ are optionally bound via $Y_{11}$ to form a ring.

8. The organometallic compound of claim 1, wherein $R_{15}$ and $R_{18}$ to $R_{20}$ are each independently selected from hydrogen, deuterium, —F, —Cl, —Br, —I, a cyano group, a $C_1$-$C_{20}$ alkyl group, a $C_3$-$C_{10}$ cycloalkyl group, and a $C_1$-$C_{10}$ heterocycloalkyl group;

a $C_1$-$C_{20}$ alkyl group, a $C_3$-$C_{10}$ cycloalkyl group, and a $C_1$-$C_{10}$ heterocycloalkyl group, each substituted with at least one selected from deuterium, —F, —Cl, —Br, and —I;

a phenyl group, a naphthyl group, a phenanthrenyl group, an anthracenyl group, a triphenylenyl group, a pyrenyl group, a chrysenyl group, a pyridinyl group, a pyrazinyl group, a pyrimidinyl group, a triazinyl group, a quinolinyl group, and an isoquinolinyl group;

a phenyl group, a naphthyl group, a phenanthrenyl group, an anthracenyl group, a triphenylenyl group, a pyrenyl group, a chrysenyl group, a pyridinyl group, a pyrazinyl group, a pyrimidinyl group, a triazinyl group, a quinolinyl group, and an isoquinolinyl group, each substituted with at least one selected from deuterium, —F, —Cl, —Br, —I, a $C_1$-$C_{20}$ alkyl group, a $C_1$-$C_{20}$ alkoxy group, a phenyl group, a naphthyl group, and —Si($Q_{11}$)($Q_{12}$)($Q_{13}$);

a phenyl group, a naphthyl group, a phenanthrenyl group, an anthracenyl group, a triphenylenyl group, a pyrenyl group, a chrysenyl group, a pyridinyl group, a pyrazinyl group, a pyrimidinyl group, a triazinyl group, a quinolinyl group, and an isoquinolinyl group, each substituted with at least one selected from a $C_1$-$C_{20}$ alkyl group, a phenyl group, and a naphthyl group that are each substituted with at least one selected from deuterium, —F, —Cl, —Br, and —I; and —O($Q_1$), —S($Q_1$) and —Si($Q_1$)($Q_2$)($Q_3$), wherein $Q_1$ to $Q_3$ and $Q_{11}$ to $Q_{13}$ are each independently selected from a $C_1$-$C_{20}$ alkyl group, a phenyl group, and a naphthyl group; and a $C_1$-$C_{20}$ alkyl group, a phenyl group, and a naphthyl group, each substituted with at least one selected from deuterium, —F, —Cl, —Br, and —I, $R_{16}$ and $R_{17}$ are each independently selected from hydrogen, deuterium, —F, —Cl, —Br, —I, a cyano group, and a $C_1$-$C_{10}$ heterocycloalkyl group;

a $C_1$-$C_{10}$ heterocycloalkyl group substituted with at least one selected from deuterium, —F, —Cl, —Br, and —I;

a phenyl group, a naphthyl group, a phenanthrenyl group, an anthracenyl group, a triphenylenyl group, a pyrenyl group, a chrysenyl group, a pyridinyl group, a pyrazinyl group, a pyrimidinyl group, a triazinyl group, a quinolinyl group, and an isoquinolinyl group;

a phenyl group, a naphthyl group, a phenanthrenyl group, an anthracenyl group, a triphenylenyl group, a pyrenyl group, a chrysenyl group, a pyridinyl group, a pyrazinyl group, a pyrimidinyl group, a triazinyl group, a quinolinyl group, and an isoquinolinyl group, each substituted with at least one selected from deuterium, —F, —Cl, —Br, —I, a $C_1$-$C_{20}$ alkyl group, a $C_1$-$C_{20}$ alkoxy group, a phenyl group, a naphthyl group, and —Si($Q_{11}$)($Q_{12}$)($Q_{13}$);

a phenyl group, a naphthyl group, a phenanthrenyl group, an anthracenyl group, a triphenylenyl group, a pyrenyl group, a chrysenyl group, a pyridinyl group, a pyrazinyl group, a pyrimidinyl group, a triazinyl group, a quinolinyl group, and an isoquinolinyl group, each substituted with at least one selected from a $C_1$-$C_{20}$ alkyl group, a phenyl group, and a naphthyl group that are each substituted with at least one selected from deuterium, —F, —Cl, —Br, and —I; and —O($Q_1$), —S($Q_1$) and —Si($Q_1$)($Q_2$)($Q_3$), wherein $Q_1$ to $Q_3$ and $Q_{11}$ to $Q_{13}$ are each independently selected from a $C_1$-$C_{20}$ alkyl group, a phenyl group, and a naphthyl group; and a phenyl group, and a naphthyl group, each substituted with at least one selected from deuterium, —F, —Cl, —Br, and —I, and $R_{16}$ and $R_{17}$ are optionally bound via $Y_{11}$ to form a ring.

9. The organometallic compound of claim 1, wherein $R_{15}$ and $R_{18}$ to $R_{20}$ are each independently selected from hydrogen, deuterium, —F, a methyl group, an ethyl group, an n-propyl group, an iso-propyl group, an n-butyl group, a sec-butyl group, an iso-butyl group, a tert-butyl group, an n-pentyl group, a methoxy group, an ethoxy group, a cyclopentyl group, a cyclohexyl group, and a cycloheptyl group;

a methyl group, an ethyl group, an n-propyl group, an iso-propyl group, an n-butyl group, a sec-butyl group, an iso-butyl group, a tert-butyl group, an n-pentyl group, a methoxy group, an ethoxy group, a cyclopentyl group, a cyclohexyl group, and a cycloheptyl group, each substituted with at least one selected from deuterium, —F, —Cl, —Br, and —I;

a phenyl group and a naphthyl group;

a phenyl group and a naphthyl group, each substituted with at least one selected from deuterium, —F, a methyl group, an ethyl group, an n-propyl group, an iso-propyl group, an n-butyl group, a sec-butyl group, an iso-butyl group, a tert-butyl group, an n-pentyl group, a phenyl group, a naphthyl group, and —Si(CH$_3$)$_3$;

a phenyl group and a naphthyl group, each substituted with at least one selected from a methyl group, an ethyl group, an n-propyl group, an iso-propyl group, an n-butyl group, a sec-butyl group, an iso-butyl group, a tert-butyl group, an n-pentyl group, a phenyl group, and a naphthyl group that are each substituted with at least one selected from deuterium and —F; and —O($Q_1$), —S($Q_1$) and —Si($Q_1$)($Q_2$)($Q_3$), wherein $Q_1$ to $Q_3$ are each independently selected from a methyl group, an ethyl group, an n-propyl group, an iso-propyl group, an n-butyl group, a sec-butyl group, an iso-butyl group, a tert-butyl group, an n-pentyl group, a phenyl group, and a naphthyl group; and a methyl group, an ethyl group, an n-propyl group, an iso-propyl group, an n-butyl group, a sec-butyl group, an iso-butyl group, a tert-butyl group, an n-pentyl group, a phenyl group, and a naphthyl group, each substituted with at least one selected from deuterium and —F, $R_{16}$ and $R_{17}$ are each independently are each independently selected from hydrogen, deuterium, —F, a methoxy group, and an ethoxy group;

a methoxy group or an ethoxy group, each substituted with at least one selected from deuterium, —Cl, —Br, and —I;

a methoxy group or an ethoxy group, wherein all of the hydrogens are substituted with —F;

a phenyl group and a naphthyl group;

a phenyl group and a naphthyl group, each substituted with at least one selected from deuterium, —F, a methyl group, an ethyl group, an n-propyl group, an iso-propyl group, an n-butyl group, a sec-butyl group, an iso-butyl group, a tert-butyl group, an n-pentyl group, a phenyl group, a naphthyl group, and —Si(CH$_3$)$_3$;

a phenyl group and a naphthyl group, each substituted with at least one selected from a methyl group, an ethyl group, an n-propyl group, an iso-propyl group, an n-butyl group, a sec-butyl group, an iso-butyl group, a tert-butyl group, an n-pentyl group, a phenyl group, and a naphthyl group that are each substituted with at least one selected from deuterium and —F; and —O(Q$_1$), —S(Q$_1$) and —Si(Q$_1$)(Q$_2$)(Q$_3$), wherein Q$_1$ to Q$_3$ are each independently selected from a methyl group, an ethyl group, an n-propyl group, an iso-propyl group, an n-butyl group, a sec-butyl group, an iso-butyl group, a tert-butyl group, an n-pentyl group, a phenyl group, and a naphthyl group; and a methyl group, an ethyl group, an n-propyl group, an iso-propyl group, an n-butyl group, a sec-butyl group, an iso-butyl group, a tert-butyl group, an n-pentyl group, a phenyl group, and a naphthyl group, each substituted with at least one selected from deuterium and —F, and R$_{16}$ and R$_{17}$ are optionally bound via Y$_{11}$ to form a ring.

10. The organometallic compound of claim 1, wherein

R$_{15}$ and R$_{18}$ to R$_{20}$ are each independently selected from hydrogen, deuterium, —F, a methyl group, an ethyl group, an n-propyl group, an iso-propyl group, an iso-butyl group, a tert-butyl group, a cyclopentyl group, a cyclohexyl group, —CD$_3$, —CD$_2$H, —CDH$_2$, —CF$_3$, —CF$_2$H, —CFH$_2$, —OCF$_3$, —Si(CH$_3$)$_3$, and a group represented by one of Formulae 5-1 to 5-15;

R$_{16}$ and R$_{17}$ are each independently selected from hydrogen, deuterium, —F, —OCF$_3$, —Si(CH$_3$)$_3$, and a group represented by one of Formulae 5-1 to 5-15:

5-1
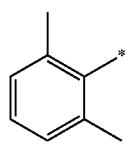

5-2
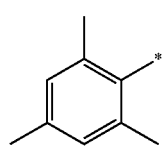

5-3
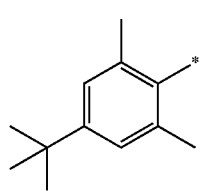

5-4
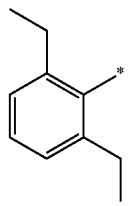

5-5
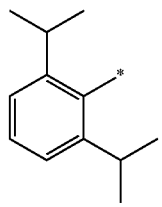

5-6
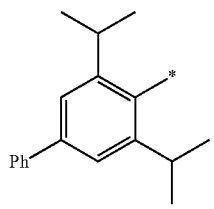

5-7
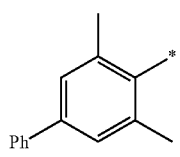

5-8
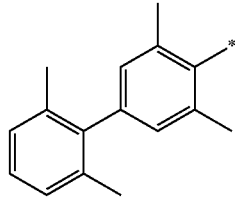

5-9
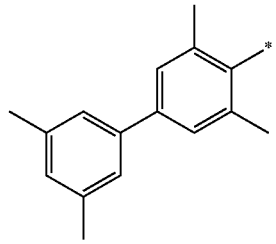

5-10
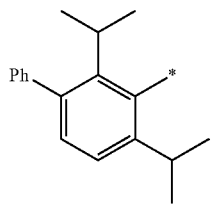

5-11
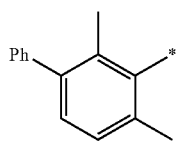

-continued

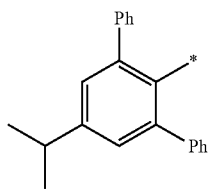
5-12

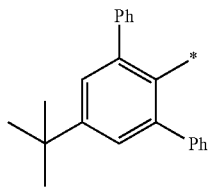
5-13

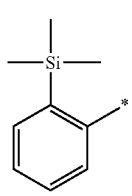
5-14

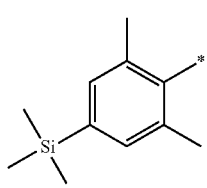
5-15 wherein, in Formulae 5-1 to 5-15,
* indicates a binding site to an adjacent atom, and
"Ph" represents a phenyl group.

11. The organometallic compound of claim 1, wherein $Y_{11}$ is selected from a substituted or unsubstituted methylene group, a substituted or unsubstituted ethylene group, and a substituted or unsubstituted propylene group.

12. The organometallic compound of claim 1, wherein $Y_{11}$ is a group represented by Formula 8-1:

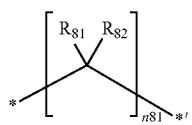

Formula 8-1 wherein, in Formula 8-1,
$R_{81}$ and $R_{82}$ are each independently selected from hydrogen, deuterium, —F, —Cl, —Br, —I, a cyano group, a $C_1$-$C_{20}$ alkyl group, a $C_3$-$C_{10}$ cycloalkyl group, and a $C_1$-$C_{10}$ heterocycloalkyl group;
a $C_1$-$C_{20}$ alkyl group, a $C_3$-$C_{10}$ cycloalkyl group, and a $C_1$-$C_{10}$ heterocycloalkyl group, each substituted with at least one selected from deuterium, —F, —Cl, —Br, and —I;
a phenyl group, a naphthyl group, a phenanthrenyl group, an anthracenyl group, a triphenylenyl group, a pyrenyl group, a chrysenyl group, a pyridinyl group, a pyrazinyl group, a pyrimidinyl group, a triazinyl group, a quinolinyl group, and an isoquinolinyl group;
a phenyl group, a naphthyl group, a phenanthrenyl group, an anthracenyl group, a triphenylenyl group, a pyrenyl group, a chrysenyl group, a pyridinyl group, a pyrazinyl group, a pyrimidinyl group, a triazinyl group, a quinolinyl group and an isoquinolinyl group, each substituted with at least one selected from deuterium, —F, —Cl, —Br, —I, a $C_{20}$ alkyl group, a $C_1$-$C_{20}$ alkoxy group, a phenyl group, a naphthyl group, and —Si($Q_{11}$)($Q_{12}$)($Q_{13}$);
a phenyl group, a naphthyl group, a phenanthrenyl group, an anthracenyl group, a triphenylenyl group, a pyrenyl group, a chrysenyl group, a pyridinyl group, a pyrazinyl group, a pyrimidinyl group, a triazinyl group, a quinolinyl group, and an isoquinolinyl group, each substituted with at least one selected from a $C_1$-$C_{20}$ alkyl group, a phenyl group, and a naphthyl group that are each substituted with at least one selected from deuterium, —F, —Cl, —Br, and —I; and
—O($Q_1$), —S($Q_1$) and —Si($Q_1$)($Q_2$)($Q_3$),
wherein $Q_1$ to $Q_3$ and $Q_{11}$ to $Q_{13}$ are each independently selected from a $C_1$-$C_{20}$ alkyl group, a phenyl group, and a naphthyl group; and
a $C_1$-$C_{20}$ alkyl group, a phenyl group, and a naphthyl group, each substituted with at least one selected from deuterium, —F, —Cl, —Br, and —I,
n81 is selected from 1, 2, and 3, and
* and *' each independently indicate a binding site to an adjacent atom.

13. The organometallic compound of claim 1, wherein $L_{11}$ is a ligand represented by one of Formulae 3-1 to 3-9:

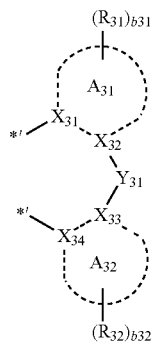
3-1

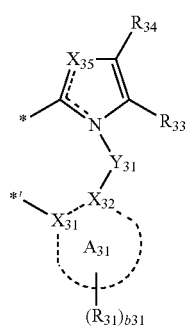
3-2

-continued 3-3
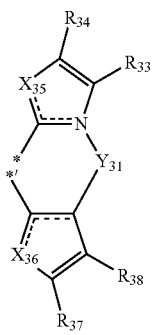

3-4
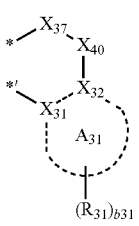

3-5
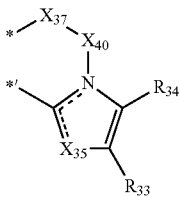

3-6
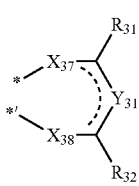

3-7
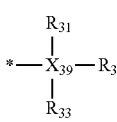

3-8
$*—X_{39}—R_{32}$

3-9
$*—X_{31}\equiv X_{32}—R_{31}$ wherein, in Formulae 3-1 to 3-9,
$A_{31}$ and $A_{32}$ are each independently selected from a $C_5$-$C_{20}$ carbocyclic group and a $C_1$-$C_{20}$ heterocyclic group,
$X_{31}$ to $X_{34}$ are each independently selected from C and N,
$X_{35}$ is selected from O, S, and $N(R_{35})$, $X_{36}$ is selected from O, S, and $N(R_{36})$,
$X_{37}$ and $X_{35}$ are each independently selected from N, O, $N(R_{33})$, $P(R_{33})(R_{34})$, and
$As(R_{33})(R_{34})$, wherein in Formula 3-5, $R_{33}$, $R_{34}$, and $R_{35}$ are the same or different,
$X_{39}$ is selected from P and As,
$X_{40}$ is selected from C(=O) and $C(R_{35})(R_{36})$,
$Y_{31}$ is selected from a single bond, a double bond, a substituted or unsubstituted $C_1$-$C_5$ alkylene group, a substituted or unsubstituted $C_2$-$C_5$ alkenylene group, and a substituted or unsubstituted $C_6$-$C_{10}$ arylene group, $R_{31}$ to $R_{38}$ are each independently selected from hydrogen, deuterium, —F, —Cl, —Br, —I, a cyano group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, $R_{31}$ and $R_{32}$ are optionally bound to form a ring, $R_{33}$ and $R_{34}$ are optionally bound to form a ring,
$R_{37}$ and $R_{38}$ are optionally bound to form a ring,
b31 and b32 are each independently selected from 1, 2, 3, and 4, and
* and *' each independently indicate a binding site to an adjacent atom.

14. The organometallic compound of claim 1, wherein m is selected from 0 and 1.

15. The organometallic compound of claim 1, wherein the organometallic compound represented by one of Formulae 1A and 1B is represented by one of Formulae 1-1 and 1-2:

Formula 1-1
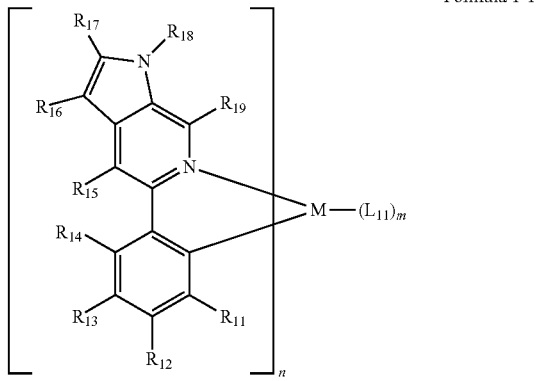

Formula 1-2
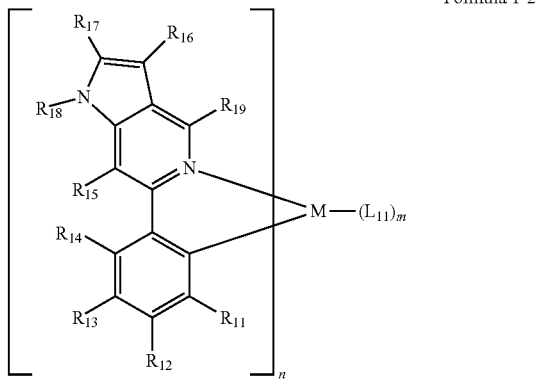

wherein, in Formulae 1-1 and 1-2,

M, n, $L_{11}$, and m are the same as those defined in Formulae 1A and 1B, and $R_{11}$ to $R_{15}$ and $R_{18}$ to $R_{19}$ are each independently selected from hydrogen, deuterium, —F, —Cl, —Br, —I, a cyano group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —O($Q_1$), —S($Q_1$), and —Si($Q_1$)($Q_2$)($Q_3$), wherein $Q_1$ to $Q_3$ are each independently selected from a substituted or unsubstituted $C_1$-$C_{60}$ alkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, $R_{16}$ and $R_{17}$ are each independently selected from hydrogen, deuterium, —F, —Cl, —Br, —I, a cyano group, a substituted or unsubstituted $C_2$-$C_{60}$ alkenyl group, a substituted or unsubstituted $C_2$-$C_{60}$ alkynyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —O($Q_1$), —S($Q_1$), and —Si($Q_1$)($Q_2$)($Q_3$), wherein $Q_1$ to $Q_3$ are each independently selected from a substituted or unsubstituted $C_1$-$C_{60}$ alkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

16. An organometallic compound selected from Compounds 1 to 9:

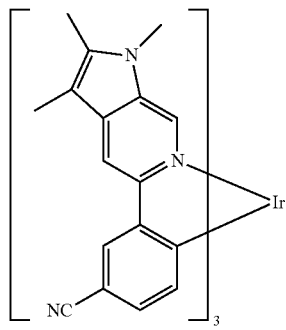

1

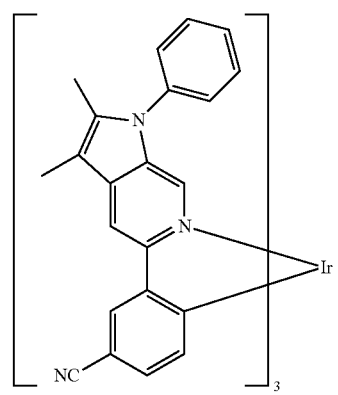

2

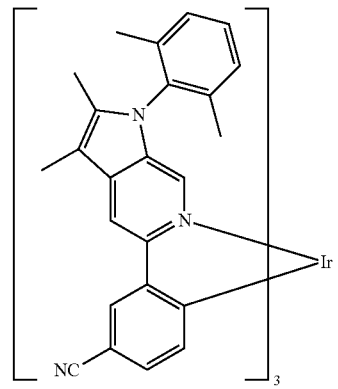

3

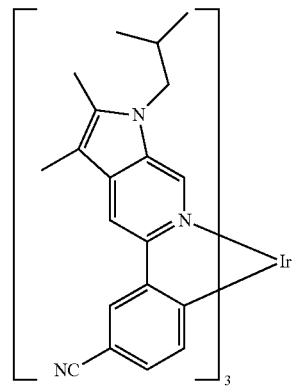

4

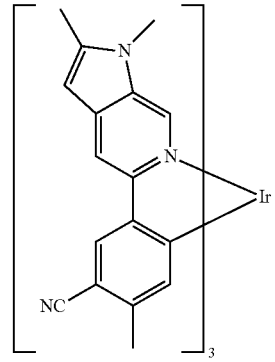

5

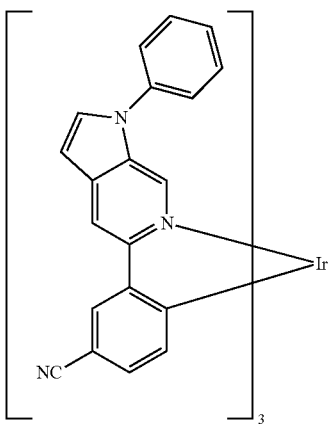

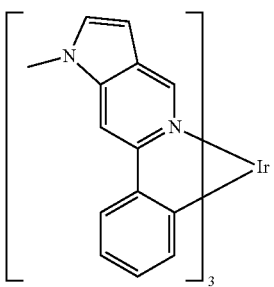

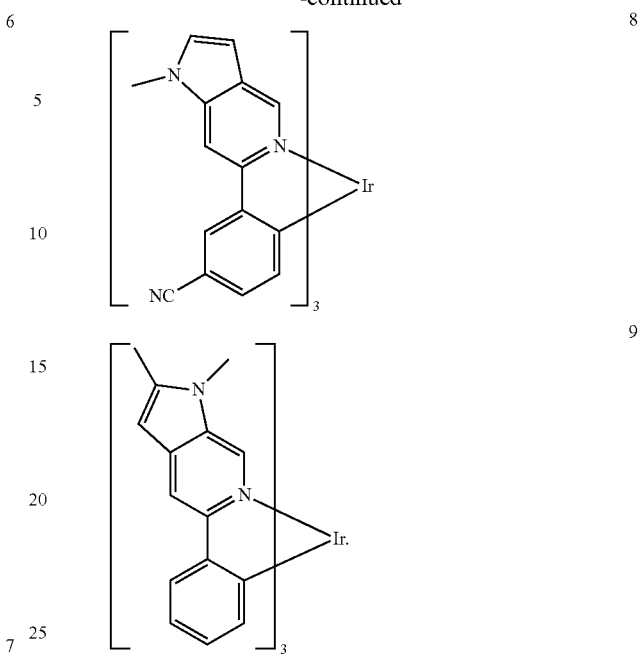

17. An organic light-emitting device comprising:
a first electrode;
a second electrode; and
an organic layer disposed between the first electrode and the second electrode,
wherein the organic layer comprises an emission layer and at least one organometallic compound of claim 1.

18. The organic light-emitting device of claim 17, wherein the emission layer comprises the at least one organometallic compound.

* * * * *